(12) United States Patent  (10) Patent No.: US 7,684,960 B1
Jacob  (45) Date of Patent: Mar. 23, 2010

(54) METHODS AND SYSTEMS FOR SEMICONDUCTOR DIODE JUNCTION PROTECTION

(75) Inventor: Jonah H. Jacob, Brookline, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 124 days.

(21) Appl. No.: 11/874,562

(22) Filed: Oct. 18, 2007

Related U.S. Application Data

(60) Provisional application No. 60/941,082, filed on May 31, 2007, provisional application No. 60/862,005, filed on Oct. 18, 2006.

(51) Int. Cl.
*G06F 11/30* (2006.01)

(52) U.S. Cl. .......... 702/182; 702/58; 324/767; 382/154; 250/370.15; 372/36; 327/538

(58) Field of Classification Search ......... 702/182, 702/58; 356/338, 237.4, 491; 382/154, 145; 250/370.15, 338.4; 372/34, 36, 20; 324/767; 327/538
See application file for complete search history.

(56) References Cited

U.S. PATENT DOCUMENTS

| | | | |
|---|---|---|---|
| 3,997,849 A | 12/1976 | Thommen | 330/13 |
| 4,415,815 A | 11/1983 | Dijkmans et al. | 307/243 |
| 5,287,367 A | 2/1994 | Yanagawa | 372/31 |
| 5,604,758 A | 2/1997 | AuYeung et al. | 372/34 |
| 5,752,100 A * | 5/1998 | Schrock | 396/129 |
| 5,812,580 A | 9/1998 | Nabiev et al. | 372/49 |
| 5,818,857 A | 10/1998 | Palmer | 372/32 |
| 5,966,394 A | 10/1999 | Spurr et al. | 372/34 |
| 6,229,833 B1 | 5/2001 | Noda et al. | 372/38.09 |
| 7,128,167 B2 * | 10/2006 | Dunlop et al. | 175/24 |
| 7,495,874 B2 * | 2/2009 | Mangano | 361/56 |
| 7,505,493 B1 * | 3/2009 | Jacob | 372/29.015 |
| 2002/0190666 A1 | 12/2002 | Sakamoto et al. | 315/291 |
| 2003/0039280 A1 | 2/2003 | Mangano et al. | 372/38.02 |
| 2003/0048820 A1 | 3/2003 | Fischer | 372/38.02 |
| 2003/0058906 A1 | 3/2003 | Finn et al. | 372/34 |
| 2003/0091077 A1 | 5/2003 | Fischer | 372/38.02 |
| 2003/0152390 A1 | 8/2003 | Stewart et al. | 398/135 |
| 2007/0210854 A1 * | 9/2007 | Mangano | 327/538 |
| 2007/0273432 A1 * | 11/2007 | Mangano | 327/538 |
| 2008/0172205 A1 * | 7/2008 | Breton et al. | 702/181 |
| 2009/0073440 A1 * | 3/2009 | Tiemeyer | 356/338 |
| 2009/0092162 A1 * | 4/2009 | Huff et al. | 372/36 |

FOREIGN PATENT DOCUMENTS

JP  2005057036 A  *  3/2005

OTHER PUBLICATIONS

Dougherty, S. et al. Roc Curve Evaluation of Edge Detector Performance. Proceedings. 1998 International Conference on Image Processing, vol. 2, Oct. 4-7, 1998, 525-529.

(Continued)

*Primary Examiner*—Carol S Tsai
(74) *Attorney, Agent, or Firm*—Burns & Levinson LLP; Jerry Cohen; Orlando Lopez

(57) ABSTRACT

Methods and systems for semiconductor diode junction protection.

20 Claims, 24 Drawing Sheets

OTHER PUBLICATIONS

Riess, E. Automatic monitoring of electrical parameters in the semiconductor industry based on ROC. IEEE Trans. on Sys., Man and Cybernetics, Part A, 30(6) Nov. 2000, 853-857.

Peterson, W. The theory of signal detectability. IEEE Transactions on Information Theory 4(4) Sep. 1954, 171-212.

U.S. Appl. No. 60/941,082 entitled Methods and Systems for Semiconductor Diode Junction Protection, filed May 31, 2007.

U.S. Appl. No. 60/862,005 entitled Methods and Systems for Semiconductor Diode Junction Protection, filed Oct. 18, 2006.

G. Beister et al. Method for Observation of Facet Degradation and Stabilization in InGaAs-QW/GaAs//AlGaAs Laser Diodes, $23^{rd}$ Int. Symp. Compound Semiconductors, Inst. Phys. Conf. Ser. No. 155 (1997) 581.

* cited by examiner

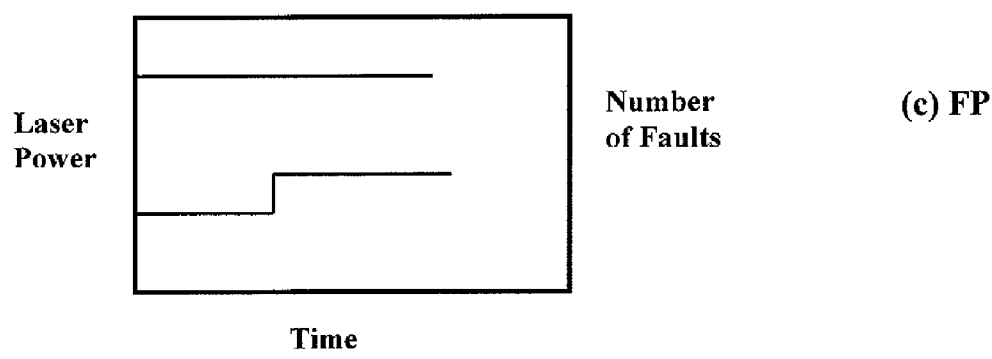
Fig. 7c  (c) FP
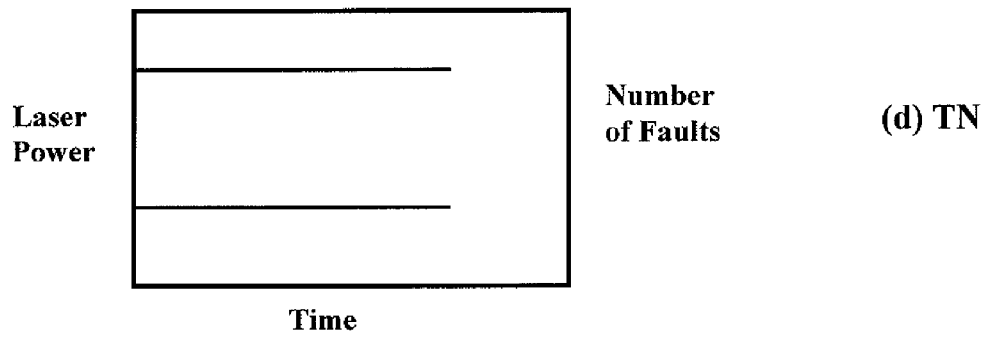
Fig. 7d  (d) TN

METHODS AND SYSTEMS FOR SEMICONDUCTOR DIODE JUNCTION PROTECTION

CROSS REFERENCE TO RELATED APPLICATIONS

This application claims priority of U.S. Provisional Application Ser. No. 60/941,082 entitled METHODS AND SYSTEMS FOR SEMICONDUCTOR DIODE JUNCTION PROTECTION, filed on May 31, 2007, and U.S. Provisional Application Ser. No. 60/862,005 entitled METHODS AND SYSTEMS FOR SEMICONDUCTOR DIODE JUNCTION PROTECTION, filed on Oct. 18, 2006, both of which are incorporated by reference herein in their entirety.

BACKGROUND

A semiconductor laser (laser diode) transforms electrical energy into optical energy with relatively high efficiency. A laser diode is typically includes a layer of p-type semiconductor material adjacent to a layer of n-type semiconductor material (referred to as a p-n junction). When electrical current passes from the p-type layer to the n-type layer, stimulated emission of optical radiation results in the active layer. In practice, the stimulated emission is limited to only a portion (the active region) of the active layer. The opposing end faces of the active region are called the facets, which are cleaved and/or etched to define a laser cavity between the two facets. A highly reflective dielectric coating is usually deposited on one facet (the non-output facet), and a semi-reflective dielectric coating on the other facet (the output coupling facet). The optical energy generated by the electric current oscillates between the output facet and the non-output facet, and is partially transmitted by the semi-reflective coating at the output facet to produce a diode laser output beam.

Laser diode bars are constructed from a linear array of such individual laser diodes, with all the diodes typically driven in parallel from two highly conducting electrodes. Stacks of these bars can then be driven in series to form a laser diode array, which is a two dimensional array of individual diodes.

Diode junction aging, associated degradation, and catastrophic failure are serious problems in laser diodes. One failure mode of laser diodes is catastrophic optical damage (COD), which occurs suddenly after more gradual diode aging in which the performance of the diode degrades slowly with time. Gradual aging is a result of localized junction overheating caused by filamentation of the diode current and of the output optical beam. Initially, current and optical filamentation of the diode current is caused by local variations in the electrical and optical properties along the diode junction. For example, variations in electric field along the junction result in local current variations and also in local optical laser beam intensity variations along the diode output. These variations in electric field and associated current density variations also lead to temperature variations along the junction. Small changes in the local electric field (2% relative to the average electric field across in the junction), for example, can lead to large changes in the local current density (relative to the average current density in the junction) and temperature, and therefore large changes locally in the intensity of the optical laser beam. Gradual aging, resulting from these current density and temperature variations, culminates in catastrophic optical damage (COD) and/or catastrophic optical mirror damage (COMD). COD and COMD are caused by an instability which rapidly leads to catastrophic overheating and results in the failure of that portion of the diode junction. COD and COMD result from destructive overheating of the junction material and/or the diode facet or coating material.

Multiple modes of laser diode failure arise from filamentation of the drive current to the diode or the diode bar, or filamentation of the optical beam within the laser active medium (the active portion of the p-n junction). These modes can range from overheating and destruction of the output facet, migration of dopants, and junction punch through.

In laser diodes, high current density must be provided in order to reach lasing threshold, and even higher current densities are needed to reach optimum laser output efficiency, laser power, and laser brightness. However, even if the laser is driven by a so-called constant current source, the current can filament in a region or regions of the active junction resulting in some sections of the junction experiencing higher current density than others. With a constant current source, these regions of higher current density have lower impedance to current flow than surrounding regions which experience lower current density than average. It is the sections of the junction experiencing higher current density that have higher temperature, age more rapidly, and are prone to unstable filamentation instabilities, In cases where the current is filamented in the diode, due for example to variations of electric field across the junction, the total current in the diode must be adjusted so that the sections of higher current density do not result in unacceptably rapid aging. However, accommodating these regions of higher current density in this manner reduces the efficiency and intensity in sections of lower current density, and therefore the overall efficiency and power of the diode is ultimately compromised. Since the bandgap of the semiconductor material changes with temperature, filamentation also leads to shifts and spreads of the output spectrum of the laser diode. These shifts and spreads in the output spectrum can reduce the efficiency of coupling to the pump bands of solid state laser media pumped by these laser diodes. Efficiency is defined as optical power output divided by electrical power input.

Initially, electric field variations and resulting current filamentation can lead to large, but stable changes in the local diode junction temperature and in the intensity of the output laser beam. Later, as these stable current, temperature, and optical intensity variations age the diode junction, the filamentation can become unstable, and the larger unstable current, temperature, and intensity changes in the region can lead to COD and/or COMD.

Controlling the current density in the junctions of laser diodes, laser diode bars (LDBs) and laser diode arrays (LDAs) is complicated by the fact that the junction bandgap decreases with increasing temperature. In junction regions having higher perturbed electric fields, the current density is higher. In these sections of the laser diode junction with higher current density, the temperature is higher and the bandgap is lower. When the bandgap shrinks, the current density in this section can increase even more at the expense of the current density in adjacent sections (even with a so-called constant current source powering the diode). The increased current density in this section then increases the temperature locally even further, and the bandgap shrinks even further. This instability can continue until the current density and temperature in this section is sufficiently high to cause cumulative incremental damage (aging) and ultimately catastrophic damage (COD and/or COMD). These instabilities can be driven by small variations in electric field across the junction, which can be caused by local changes in the junction material properties or by edge effects at the periphery of the junction. These initial variations can also be caused by crystal defects. The positive feedback process starting with increased current density in regions of higher electric field, leads to locally higher temperature, locally reduced bandgap, and then to even higher local current density. This positive feedback results in rapid thermal runaway, and breakdown locally of the p-n junction. This thermal runaway in the region of current filaments creating "hot spots" is referred to as a current filamentation instability As detailed above, operation of a semiconductor junction can lead to filamentation instabilities which constrict the current flow through the junction. Filamentation increases the current density and the temperature of the junction locally (where the current is flowing). Because the bandgap for these semiconductor junctions typically decreases as temperature rises, the locally increased junction temperature leads in some cases to even higher current density in that local region. The local increase in current density is not necessarily accompanied by an increase in total current to the device. This feedback mechanism leads to an instability in which the temperature of a section or sections of the junction continue to rise until damage is done to the semiconducting junction or to adjacent structures.

Restricting the total current to the semiconducting junction with so-called current regulation circuits or constant current drive circuits does not prevent filamentation instabilities or their consequences, which include thermal runaway, accelerated aging, and ultimately device failure. Even if the total current to the terminals of the device were held constant, device current can constrict in a local region or regions of the semiconducting junction so that excessive heat is deposited locally in a limited region or regions of the junction. Such localized junction heating along only a portion of the junction leads to local thermal runaway, accelerated device aging and ultimately premature device failure.

Measuring or sensing the external temperature of the device and then interrupting the current to the device when a temperature anomaly is sensed may not be effective in preventing these instabilities and their consequences (thermal runaway, accelerated device aging; and ultimately premature device failure). When current filamentation instabilities occur, the external temperature of the device may rise, fall, or stay the same. So measuring the temperature of the outer surface of the device (the device case) with a temperature sensing device is not necessarily an indicator of these instabilities. Temperatures of interest in catastrophic optical damage of the laser facet are the local temperatures caused by excessive absorption of the optical power at small regions of the junction. Temperatures of interest in catastrophic damage to the junction itself are in the active region of the junction which is a thin layer region (0.1 to 1.0 microns sandwiched between thick layers (50-100 microns) of semiconductor material. Temperature anomalies in local regions of the semiconductor junction take time to diffuse to the device surface. This lag time may be many microseconds or milliseconds. Device damage can occur during this lag time.

In laser diode devices, these current filamentation instabilities can be exacerbated by the nonlinear interaction of the laser beam with the laser gain medium. These Kerr-type instabilities can lead to self-focusing of the laser light within the laser device. This instability can interact with the current instability described above, damaging the diode facets and leading to so-called catastrophic optical damage (COD) and catastrophic optical mirror damage (COMD).

In some semiconductor devices with diode junctions, device function is not the production of light, but to simply switch a voltage or current or to otherwise regulate a voltage or current. These devices are also subject to the current filamentation instability described above. Current instabilities in these devices also lead to thermal runaway, accelerated device aging, and ultimately device failure. High current semiconductor switch manufacturers already use special techniques to mitigate the effects of such current filamentation. Since current density need not necessarily be made high in these devices, high current semiconductor switches sometimes employ geometrical methods for spreading the current in the junction of these devices by using spider-shaped electrode structures and other current spreading geometries and techniques to divide the device current before it is injected into the semiconducting medium. It must be noted that many of the instability mitigation techniques used presently in these semiconductor switch devices cannot be used in geometries required by laser diodes, light emitting diodes and VCSELs where the current density must reach a certain minimum value to reach threshold lasing and then an even higher current density value to optimize laser output, efficiency, and brightness.

Spreading and limiting the current in laser diodes and light emitting diodes using resistive layers before the current enters the semiconducting media has also been attempted. However, the series resistance needed in these layers lead to power dissipation and unacceptable reductions in the overall electrical efficiency of these light sources. In addition, these resistive ballasting techniques ultimately cannot prevent current filamentation in the active junction region which is a thin layer sandwiched in a much thicker semiconducting medium.

Laser diodes, light emitting diodes, and VCSELs are sometimes arranged in bars or arrays. For bars in which multiple devices are driven in parallel, the same type of fault mode mitigation and protection circuitry used for a single device can be effective in suppressing and protecting against instabilities. In a laser diode bar, all of the laser diodes are driven in parallel from the same current node. Physically this current node is typically fabricated from a material with high electrical conductivity and high thermal conductivity such as copper. These current nodes also serve a second function which is to cool the individual diodes by transporting waste heat generated in the diode to a heat sink.

Current instabilities similar to those which occur in single diodes can also occur in laser diode bars. In addition to filamentation within individual diodes in the bar, this instability also causes current hogging, in which the current to the common node for all the diodes in the bar is not shared equally among the diodes in the bar. The diodes that hog more current than the average current (average current=total current to the node/the number of diodes in the bar) are prone to overheating and thermal runaway. Note that such an instability is not prevented by using current regulating circuitry or so-called constant current sources to power the laser diode bar. Although laser diodes were used here as an example, other devices containing semiconducting junctions such as light emitting diodes and VCSELs are also sometimes arranged in parallel in bars, and the same descriptions and conclusions apply to them as well.

Note that current sharing in laser diode bars can be enforced by using separate resistors in series with each diode in the bar. However, true current sharing requires that the value of the series resistance be approximately as large as the effective resistance of the laser diode, so that the electrical efficiency of such a bar would be reduced by a factor of 2 or more.

For arrays of these devices driven in series, current hogging is not an issue, since the same total current must pass through each device. However, current filamentation instabilities within each of these devices can still occur with the consequences that have been discussed above.

The concept of driving the individual diodes making up bars in series rather than in parallel may have beneficial effects since current hogging is not allowed and current sharing is imposed in a series configuration. As discussed above, laser diode bars are now driven in parallel for convenience. It is easier to cool these devices from a common, high thermal conductivity, electrode structure—the highly conducting node described above. However, high thermal conductivity, low electrical conductivity materials such as beryllium oxide and diamond can be used as electrical insulators. With these materials to remove heat from the individual diodes, it is possible to contemplate rearranging diode bars into a series configuration. Such a configuration would ensure that the current through each device in the bar is equal, thereby removing the possibility of current hogging. Such configurations however do not remove the possibility of filamentation.

In some instances, the presence of noise can mask or simulate the effects of filamentation.

BRIEF SUMMARY

In one embodiment of the method of these teachings, the method is utilized for selecting a threshold ("threshold sensitivity") for detecting anomalous behavior of a semiconductor diode junction. In that embodiment the method includes the steps of:
  a) selecting a threshold sensitivity value such that substantially no anomalous behavior is detected;
  b) reducing the threshold sensitivity by a predetermined amount;
  c) for one time interval from a number of time intervals, detecting optical power emitted from the semiconductor diode junction;
  d) for that one time interval, determine whether anomalous behavior of the semiconductor junction diode has occurred;
  e) for that one time interval, determining, according to predetermined criteria, whether the determination of whether anomalous behavior has occurred is a true positive (TP), a false-negative (FN), a false-positive (FP) or a true negative (TN);
  f) repeating steps c) through e) for each other time interval in the number of time intervals;
  g) determining, according to other predetermined criteria, a true positive fraction (TPF) and a false-positive fraction (FPF), a TPF, FPF pair corresponding to the threshold sensitivity;
  h) repeating steps b) through g), obtaining the TPF, FPF pair corresponding to each threshold sensitivity;
  i) selecting from the TPF, FPF pairs, according to a selection criterion, a desired threshold sensitivity for detection of anomalous behavior.

In another embodiment of the method of these teachings for selecting a threshold sensitivity for detecting anomalous behavior of a semi conductor diode Junction, the method includes the step of
  a) determining a relationship between a rate of false positive detections of anomalous behavior and the threshold sensitivity;
  b) Selecting a value of threshold sensitivity that provides substantially a maximum rate of false positive detections for a predetermined duty factor.

Embodiments of systems of these teachings are also disclosed.

For a better understanding of the present teachings, together with other and further needs thereof, reference is made to the accompanying drawings and detailed description and its scope will be pointed out in the appended claims

BRIEF DESCRIPTION OF THE DRAWINGS

FIG. 6b is a schematic block diagram representation of a detailed embodiment of the system of FIG. 6a;

FIGS. 7a-7d depict Schematic traces defining TP, FN, FP and TN;

DETAILED DESCRIPTION

As disclosed hereinbelow, the method and system for the detection of anomalies in diode junction behavior disclosed in U.S. patent application Ser. No. 10/922,753 and U.S. patent application Ser. No. 11/388,843, both of which are incorporated by reference herein, or/and other design techniques (such as, but not limited to, temperature control) are applied to substantially ameliorate the effects of anomalous behavior, such as filamentation.

One theoretical model describing the current filamentation anomalous behavior (also referred to as instability), which is driven by variations in the electric field across the junction and depend on the decrease in junction bandgap with increasing junction temperature, is provided in Appendix A of U.S. application Ser. No. 10/922,753, incorporated by reference herein, hereinafter referred to as "Appendix A," in order to illustrate anomalous behavior that can lead to filamentation in semiconductor devices with diode junctions. (Not desiring to be bound by theory, the present invention is not limited to the previous or any other theoretical explanation.)

Figure 3A:
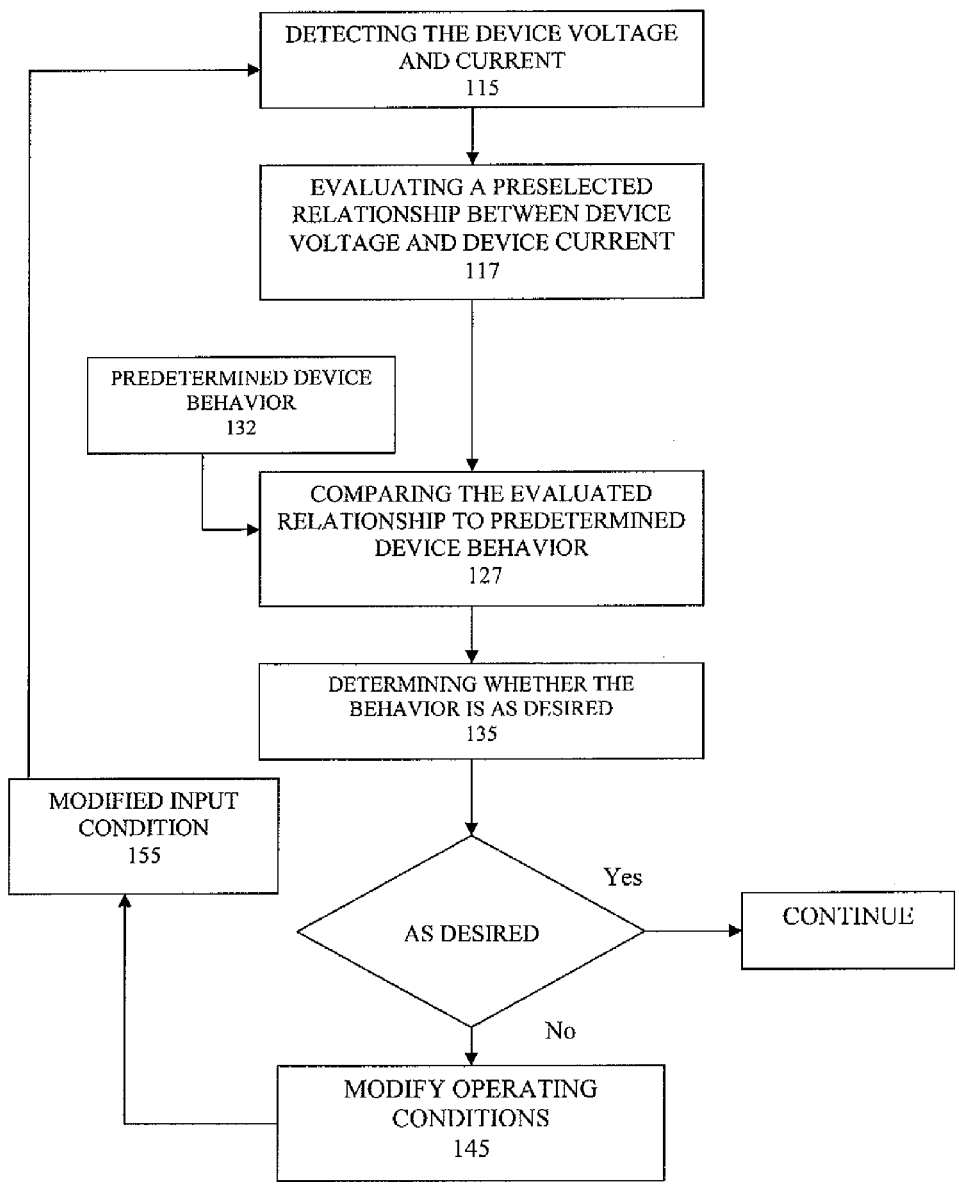
FIG. 3a is a flowchart representation of a detailed embodiment of the method for diode protection.

FIG. 3a shows a flowchart representation 100 of a detailed embodiment of the method of these teachings. Referring to FIG. 3a, the device voltage, V(t), and the device current, I(t) are measured (step 115, FIG. 3a). FIGS. 1b and 3c (representative of the results shown in Figs. A2, A3, and A4) indicate that a change in the device impedance, V(t)/I(t), accompanies the onset of the instability. This change in the device impedance, V(t)/I(t), from the stable case to the unstable case can be utilized to sense the onset of the filamentation instability. In one embodiment of the invention, the relationship between the device terminal voltage and current (Step 117, FIG. 3a) and its relationship to the active junction temperature can be calibrated for each type of diode so that the diode junction temperature can be determined from measuring a relationship between the device terminal voltage and the device current such as, but not limited to, the diode terminal impedance. Filamentation is detected by comparing (step 127, FIG. 3a) a relationship between the device terminal voltage and the device current, V(t)/If(t) in one embodiment, to a predetermined value of the relationship between the device terminal voltage and the device terminal current indicating the onset of filamentation instability (step 135, FIG. 3a). It should noted that predetermined values of the relationship between the device terminal voltage and the device terminal current for the onset of instability could be generated previously from a number of previous observations. The change in the relationship between the device terminal (or junction) voltage and the device terminal current, in one embodiment the device impedance, V(t)/I(t), indicates the transition from stable to unstable operation (from unfilamented to filamented operation), and therefore is used in this embodiment in order to terminate or reduce power to the device. Upon detection of filamentation instability in the above described manner, power is diverted away from or around the laser diode or reduced (step 145, FIG. 3a). This embodiment can include the additional steps of applying a pulse to the diode terminals for a predetermined time after terminating or reducing power to the device (step 155, FIG. 3a) and repeating steps 115 through 135 in order to determine whether the diode is ready to return to stable operation. It should be noted such probing may also be used to determine how much the current or pulse duration to the device must reduced to recover quasi-stable operation during the subsequent pulses.

Figure 3B:
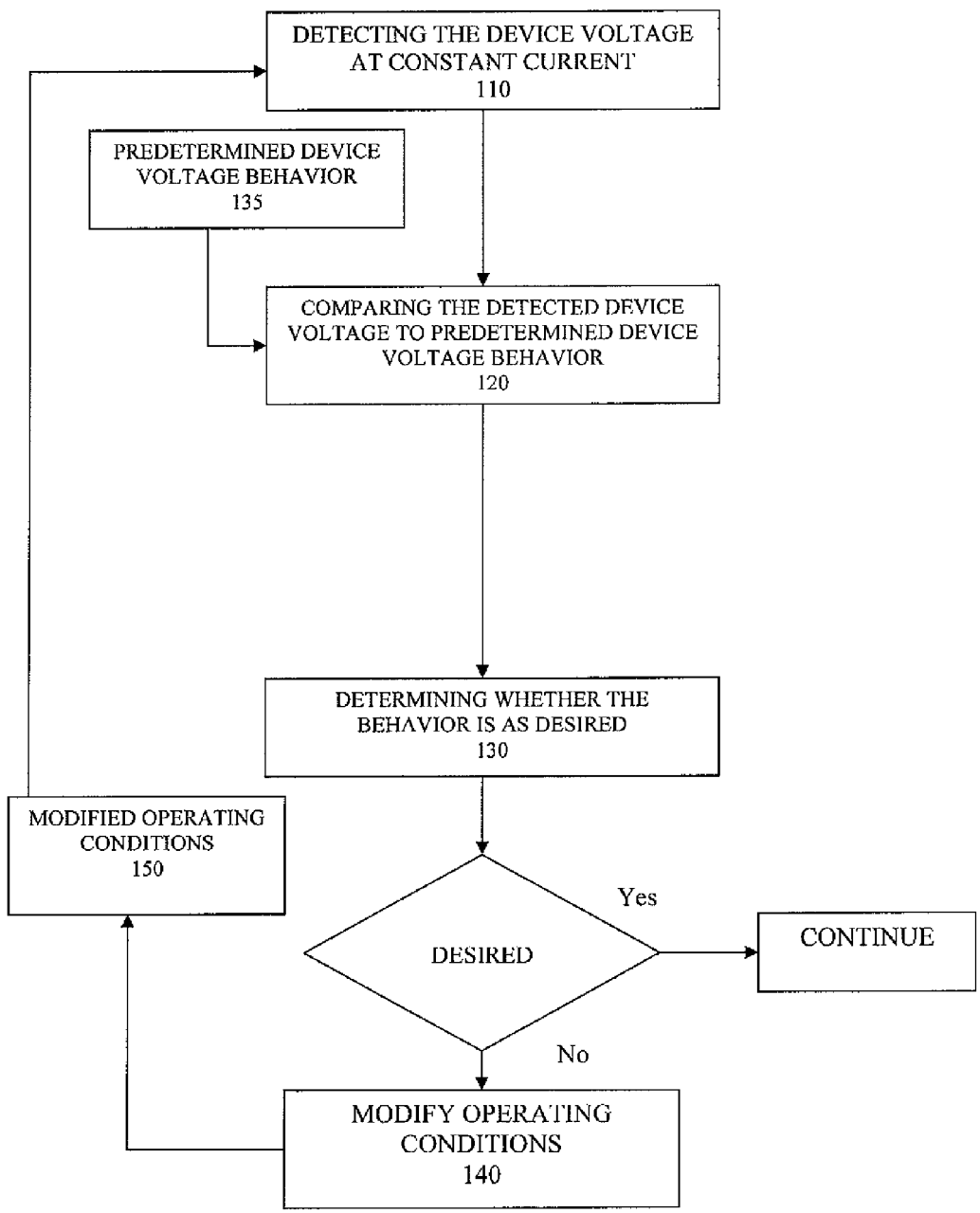
FIG. 3b is a flowchart representation of another detailed embodiment of the method for diode protection.
Figure 3C:
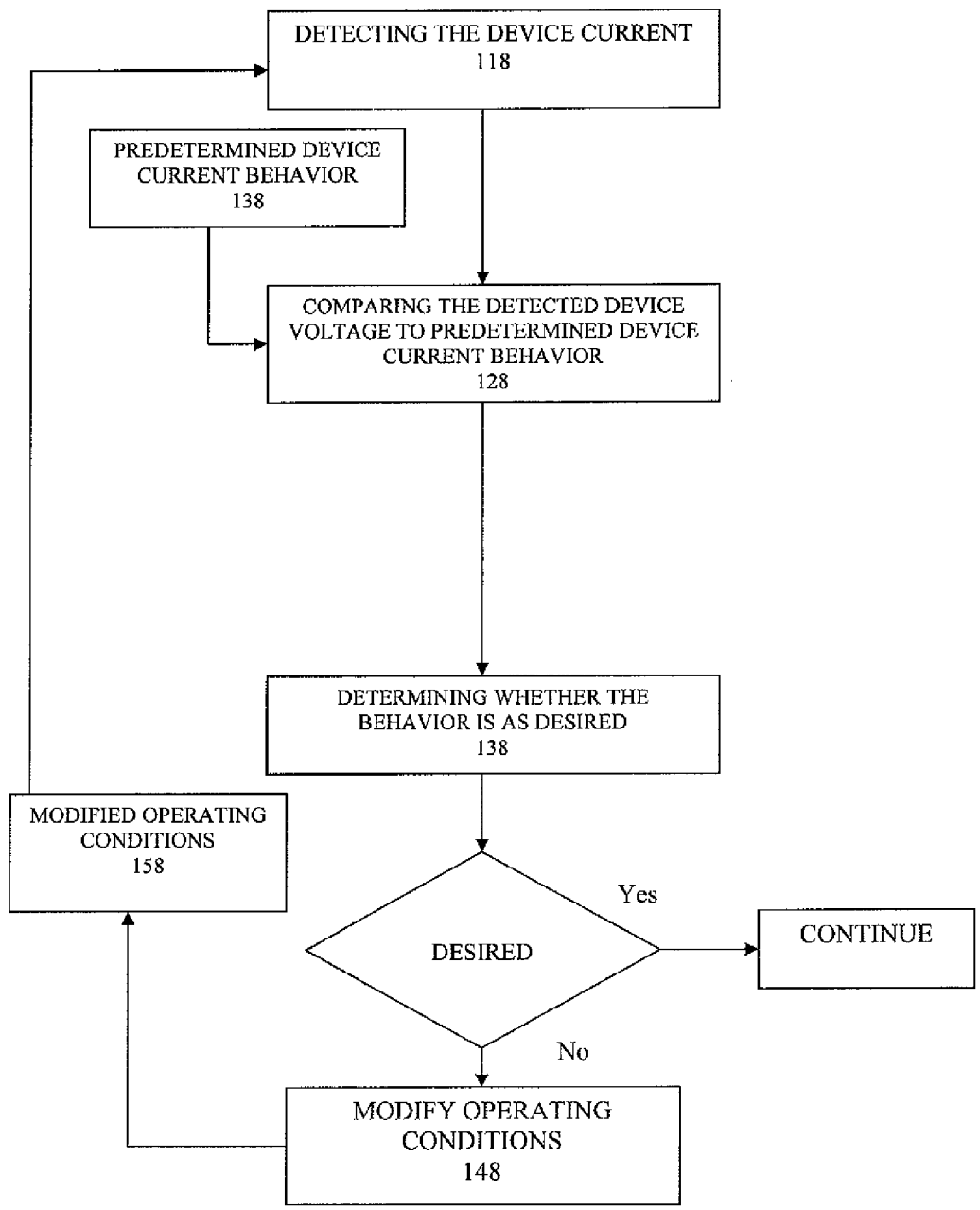
FIG. 3c is a flowchart representation of yet another detailed embodiment of the method for diode protection.

FIG. 3b shows a flowchart representation 105 of a detailed embodiment of the method of these teachings. Referring to FIG. 3b, the device voltage, V(t), is measured (step 110, FIG. 3b). FIG. 3c (representative of the results shown in Figs. A2, A3, and A4) indicates that, when the diode is driven with a constant current source, a shift in the device terminal (or junction) voltage, V(t), accompanies the onset of the instability. This shift in terminal voltage from the stable case to the unstable case can be utilized to sense the onset of the filamentation instability.

In one embodiment of the invention, the relationship between the diode terminal voltage at the equilibrium current and its relationship to the active junction temperature can be calibrated for each type of diode so that the diode junction temperature can be determined from measuring diode terminal voltage. The anomalies are detected by comparing V(t) to a predetermined values of V(t) indicating the onset of instability (step 130, FIG. 3b). It should noted that predetermined values of V(t) for the onset of instability could be generated previously from a number of previous observations. The decrease in device terminal voltage accompanies the transition from stable to unstable operation (from unfilamented to filamented operation), and therefore is used in this embodiment in order to terminate or reduce power to the device. Upon detection of filamentation anomalies, power is diverted away from or around the laser diode or reduced (step 140, FIG. 3b). This embodiment can include the additional steps of applying a pulse to the diode terminals a predetermined time after terminating or reducing power to the device (step 150, FIG. 3b) and repeating steps 110 through 130 in order to determine whether the diode is ready to return to stable operation. It should be noted such probing may also be used to determine how much the current or pulse duration to the device must reduced to recover quasi-stable operation in pulsed operation.

One example of the analytic relationship that might exist between the change in diode terminal voltage at a preselected current and the resulting change in junction temperature is provided by the calculation in Appendix A (Equations 5-8).

The junction temperature rise typically leads to a shift in diode emission to longer or shorter wavelengths. One theoretical explanation of the wavelength shift is that it is a direct result of the decrease in photonic junction bandgap with increasing temperature. Such wavelength shifts in the diode output beam can also be used to sense the onset of filamentation, since filamentation instabilities produce regions of enhanced temperature and thus longer wavelength radiation.

FIG. 3c shows a flowchart representation 108 of another detailed embodiment of the method of these teachings in which the device current, I(t), is measured (step 118, FIG. 3c).

The junction temperature rise typically leads to a shift in diode emission to longer and/or shorter wavelengths. According to one explanation, this wavelength shift is a direct result of the decrease in photonic junction bandgap with increasing temperature. Such wavelength shifts in the diode output beam can also be used to sense a change in refractive index and, thus, phase.

Figure 4A:
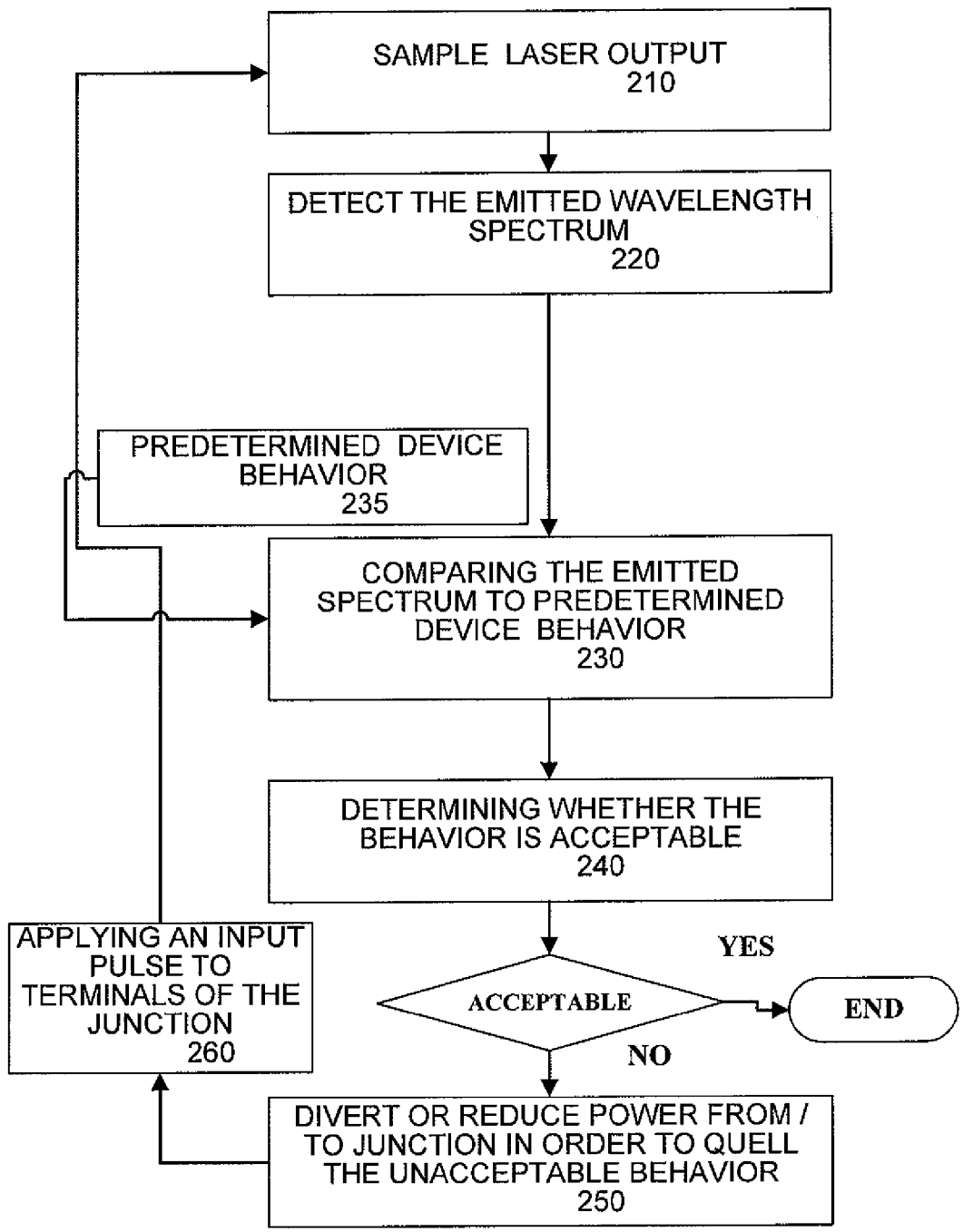
FIGS. 4a, 4b are flowchart representations of yet other detailed embodiments of the method for diode protection.

FIG. 4a shows a flowchart representation of another detailed embodiment of the method of these teachings. Referring to FIG. 4a, a small sample of the total laser diode output is obtained (step 210, FIG. 4a) and the wavelengths of the laser diode output detected (step 220, FIG. 4a). The wavelength is compared to a predetermined behavior (step 230, FIG. 4a). If the behavior of the device terminal (or junction) voltage is not as indicated by the predetermined behavior, the operating conditions are changed in order to alter the detected relationship so that it is closer to the desired value (step 250, FIG. 4a). This embodiment can include the additional steps of applying the modified input conditions (step 260, FIG. 4a).

Figure 4B:
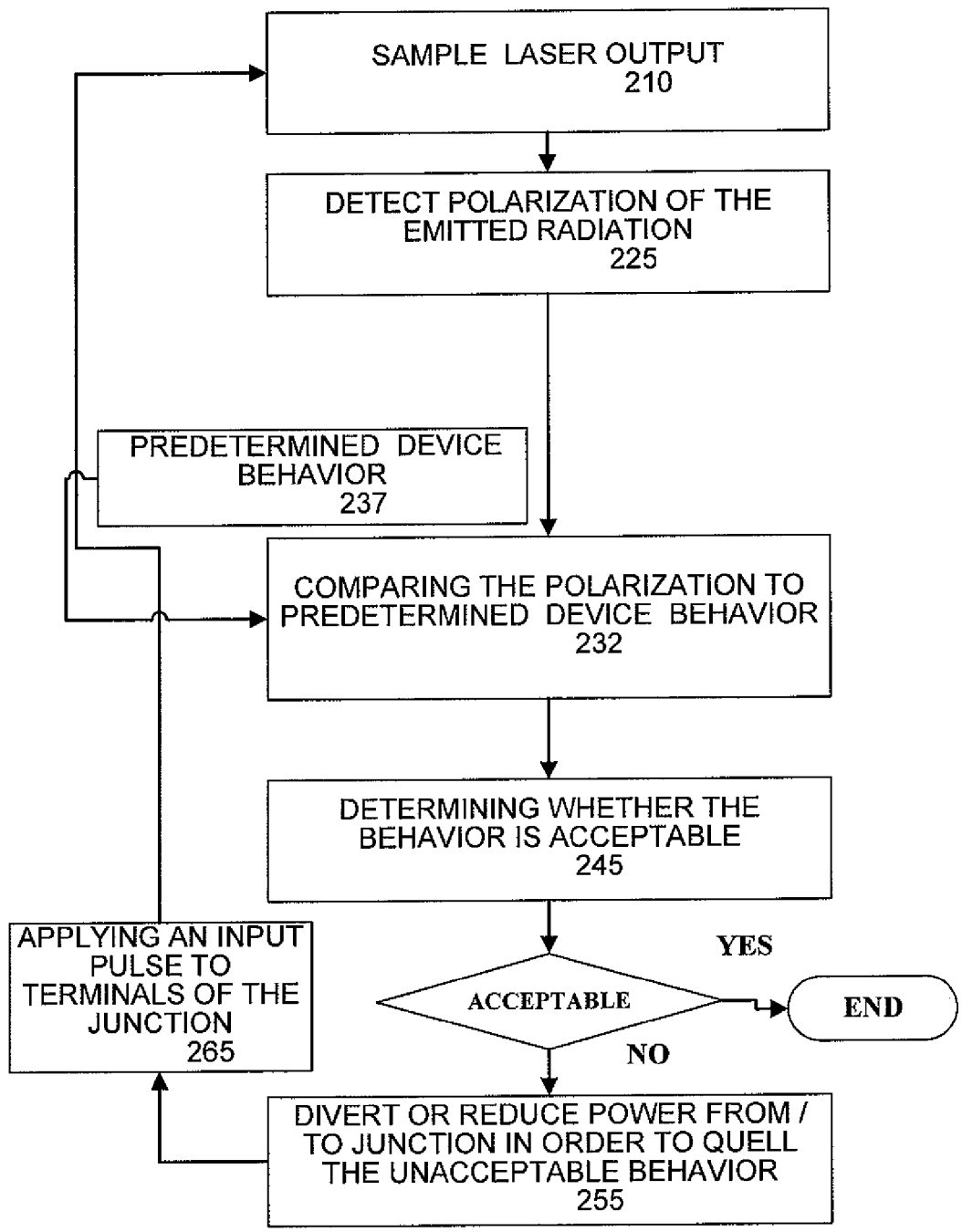

FIG. 4b shows a flowchart representation of yet another detailed embodiment of the method of these teachings. Referring to FIG. 4b, a small sample of the total laser diode output is obtained (step 210, FIG. 4a) and one or more polarization states of the laser diode output detected (step 225, FIG. 4b). The one or more polarization states are compared to a predetermined behavior (step 232, FIG. 4b). If the behavior of the device (or junction) is not as indicated by the predetermined behavior (237, FIG. 4b), the operating conditions are changed in order to alter the detected relationship so that it is closer to the desired value or to quench anomalous behavior (step 255, FIG. 4b). This embodiment can include the additional steps of applying the modified input conditions (step 265, FIG. 4b). The embodiment, shown in FIG. 4b, of the method of these teachings can be applied to protecting junction devices, in which case the operating conditions are modified in to quench the anomalous behavior. In applying the method to protecting junction devices, in one instance, the operating conditions are changed by either removing or reducing the input power (or driving current) to the junction device. In applying the method to controlling the phase in laser diodes or laser diode arrays, the input conditions are modified in order to alter the detected relationship so that the detected relationship is closer to the desired value.

While the embodiments of the method of these teachings shown in FIGS. 3a through 3c and in FIGS. 4a-4b are shown for a single device, the methods of these teachings also apply to multiple devices.

Figure 5A:
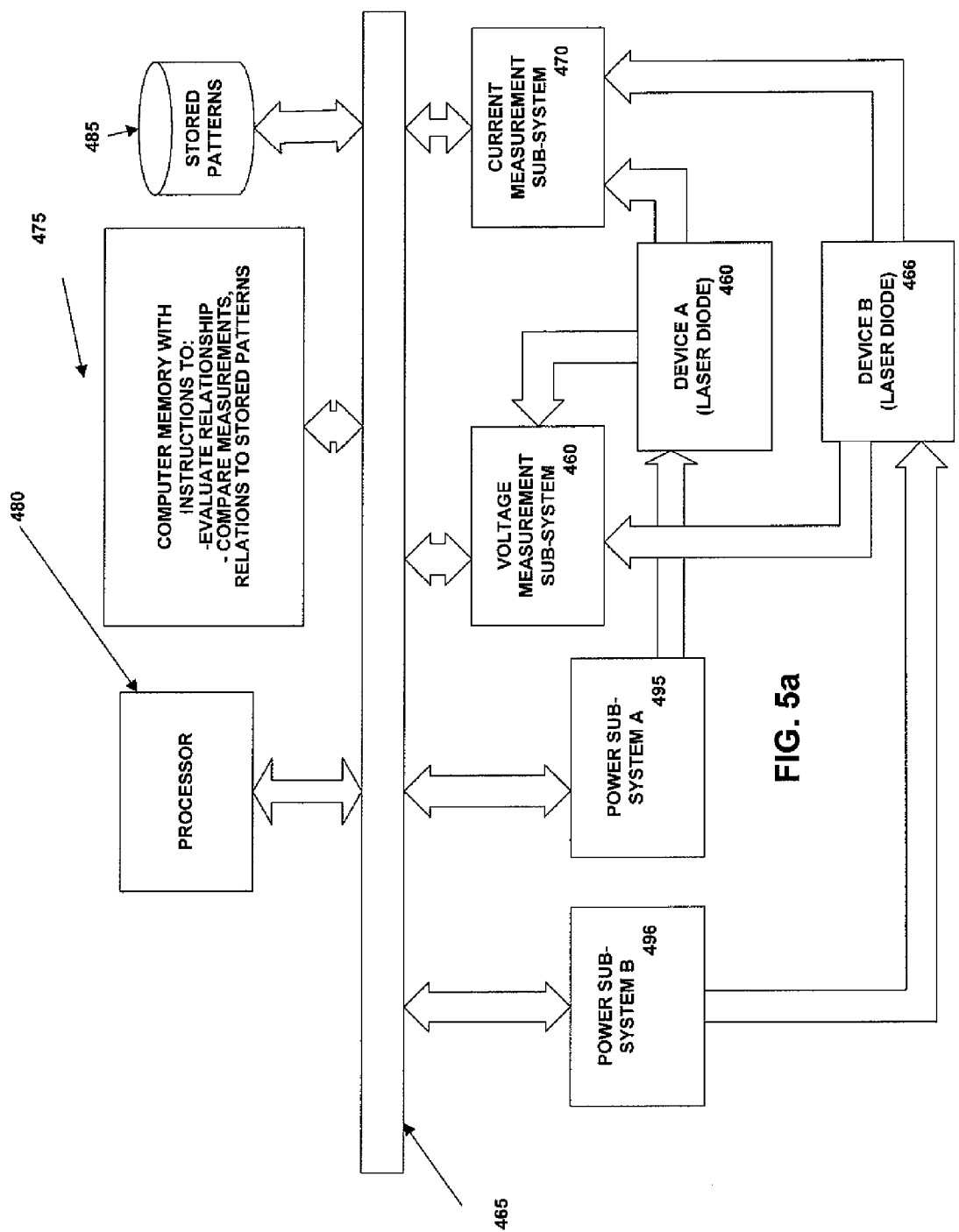
FIG. 5a is a schematic block diagram representation of one embodiment of the system for diode protection.

The above-described methods of these teachings can be implemented by the systems of these teachings. FIG. 5a shows a schematic block diagram representation of an embodiment of a system 490 of these teachings. Referring to FIG. 5a, a voltage measurement system 460 provides the laser diode voltage of either laser diode A 460 and/or laser diode B 468 at discrete time intervals to an operable connection 465, such as a computer bus. A current measurement system 470 provides the laser diode current at discrete time intervals to the operable connection 465. A computer readable memory 475 has a computer readable code embodied therein to instruct a processor 480 to evaluate a relationship between the laser diode voltage and the laser diode current and compare the relationship to the data from a stored pattern (or behavior) 485, and generate a power signal, to power sub-system A and/or power sub-system B, based on the comparison.

Figure 5B:
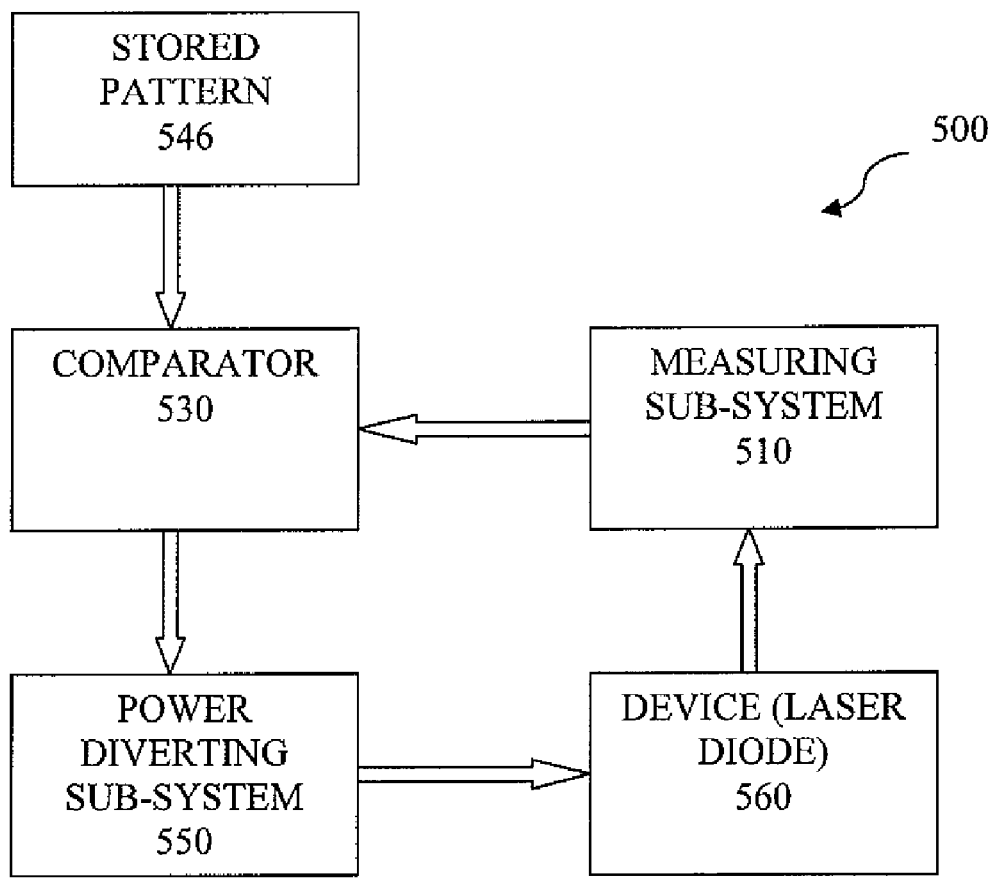
FIG. 5b is a schematic block diagram representation of another embodiment of the system for diode protection.

FIG. 5b shows a schematic block diagram representation of another embodiment of a system 500 of these teachings. Referring to FIG. 5b, a measurement system 510 provides a measurement utilized in determining the behavior of the junction device. In some exemplary embodiments, these teachings not be limited only to those embodiments, the measurement includes the laser diode (junction device) voltage, V(t) as a function of time, and/or the laser diode (junction device) current, at discrete time intervals. In one embodiment, the laser diode (junction device) voltage, V(t), and/or the laser diode (junction device) current are analog signals. A reference signal 540 from a database of values is compared, by means of a comparator 530, to the measured values generated by the measurement system 510. The comparator 530 can be an analog system or a hybrid analog/digital system, which sends a signal, to power modifying system 550 based on the comparison.

Figure 5C:
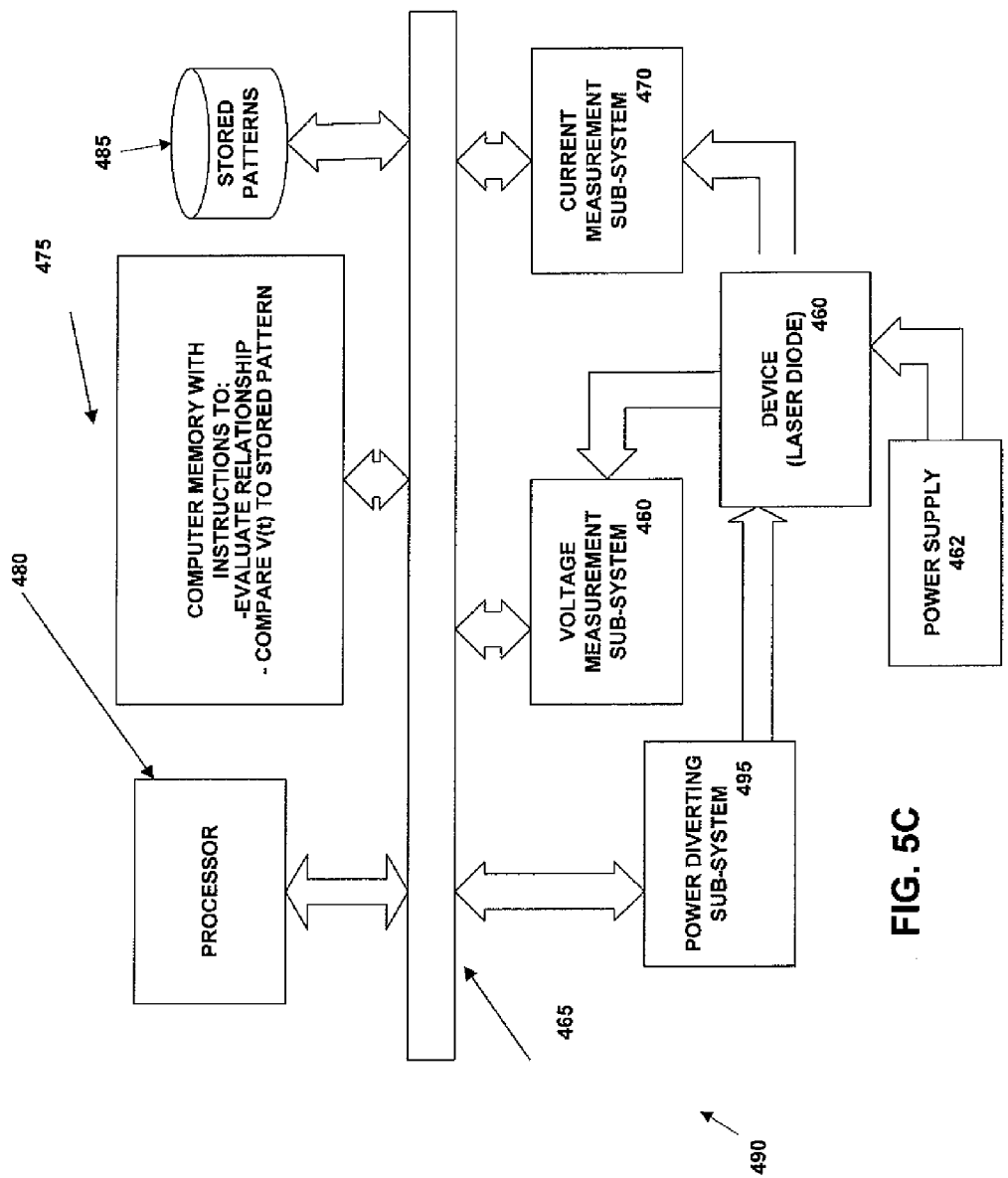
FIG. 5c is a schematic block diagram representation of yet another embodiment of the system for diode protection.

FIG. 5c shows a schematic block diagram representation of yet another embodiment of a system 490 of these teachings. Referring to FIG. 5c, a voltage measurement system 460 provides the laser diode voltage at discrete time intervals to an operable connection 465, such as a computer bus. A current measurement system 470 provides the laser diode current at discrete time intervals to the operable connection 465. A computer readable memory 475 has a computer readable code embodied therein to instruct a processor 480 to evaluate a relationship between the laser diode voltage and the laser diode current and compare the relationship to the data from a stored pattern (or behavior) 485 indicating the onset of instability, and generate a power diversion signal based on the comparison. The power diversion signal is provided to the power diverting system 495. The removal of power by the power diverting system 495 occurs in less than the characteristic time corresponding to the thermal instability growth rate. The power diverting system 495 can also reapply power pulses only after a time required for the dissipation of the local increase in temperature (localized thermal "hot spots"). The voltage waveform can, in one embodiment, be utilized to sense return to normal (after dissipation of the local increase in temperature) conditions.

Figure 5D:
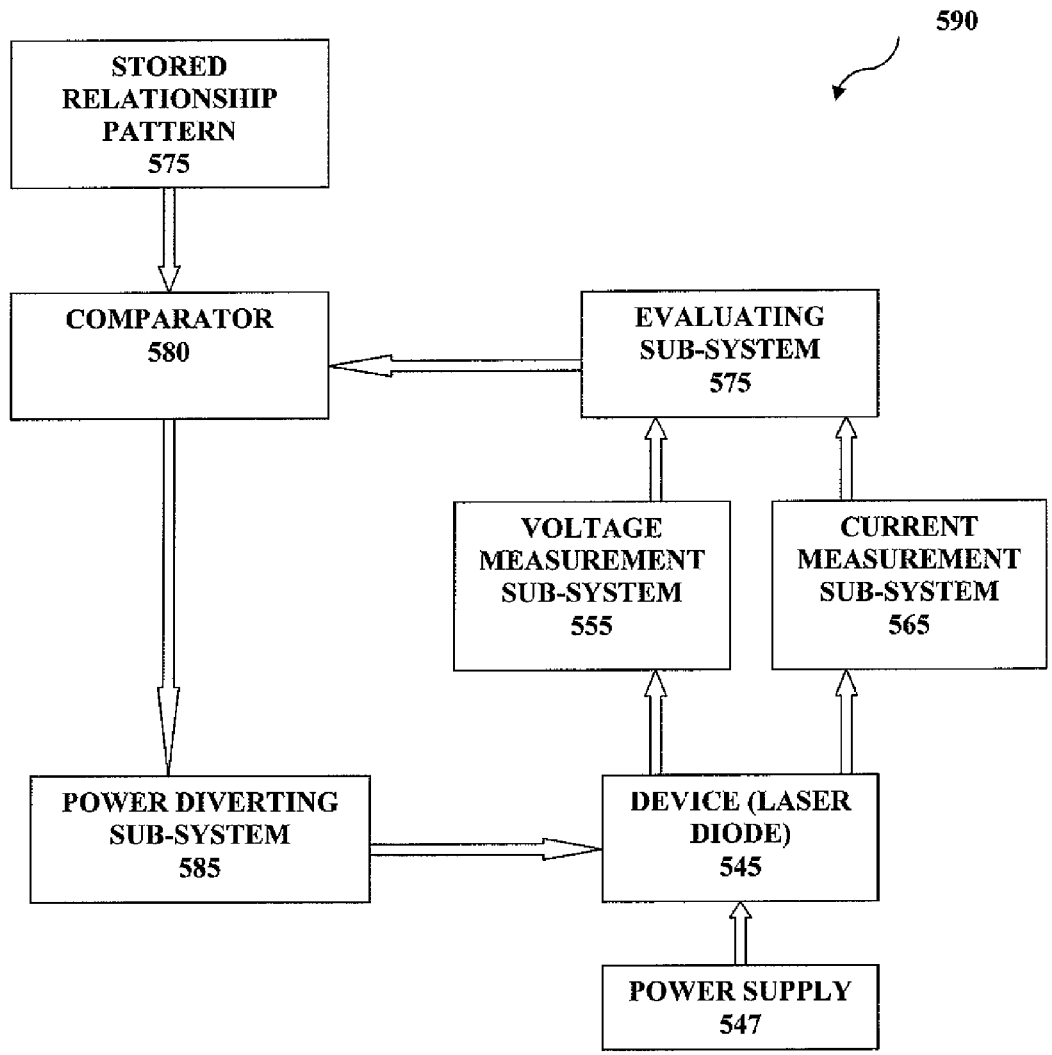
FIG. 5d is a schematic block diagram representation of a further embodiment of the system for diode protection.

FIG. 5d shows a schematic block diagram representation of a further embodiment of a system 590 of these teachings. Referring to FIG. 5d, a voltage measurement system 555 provides the laser diode voltage, V(t) as a function of time. In one embodiment the laser diode voltage, V(t), is an analog signal. A current measurement system 565 provides the laser diode current, I(t), as a function of time. In one embodiment, the laser diode current, I(t), is an analog signal. An evaluating sub-system 570 receives the laser diode voltage, V(t), and the laser diode current, I(t), and evaluates a relationship between the laser diode voltage and the laser diode current such as the impedance. The relationship, in one embodiment, is an analog signal. A reference signal 575 from a database of values of the relationship between the laser diode voltage and the laser diode current indicating the onset of instability is compared, by means of a comparator 580, to the values of the relationship generated by the evaluating sub-system 570. The comparator 580 can be an analog system or a hybrid analog/digital system. If the comparison indicates that the laser diode operation has departed from normal, a power diversion signal is provided to the power diverting system 585. The removal or reduction of power by the power diverting system 585 occurs in less than the characteristic time corresponding to the thermal instability growth rate. The power diverting system 585 can also reapply power pulses only after a time required for the dissipation of the local increase in temperature (localized thermal "hot spots"). The voltage waveform can, in one embodiment, be utilized to sense return to normal (after dissipation of the local increase in temperature) conditions.

Figure 6A:
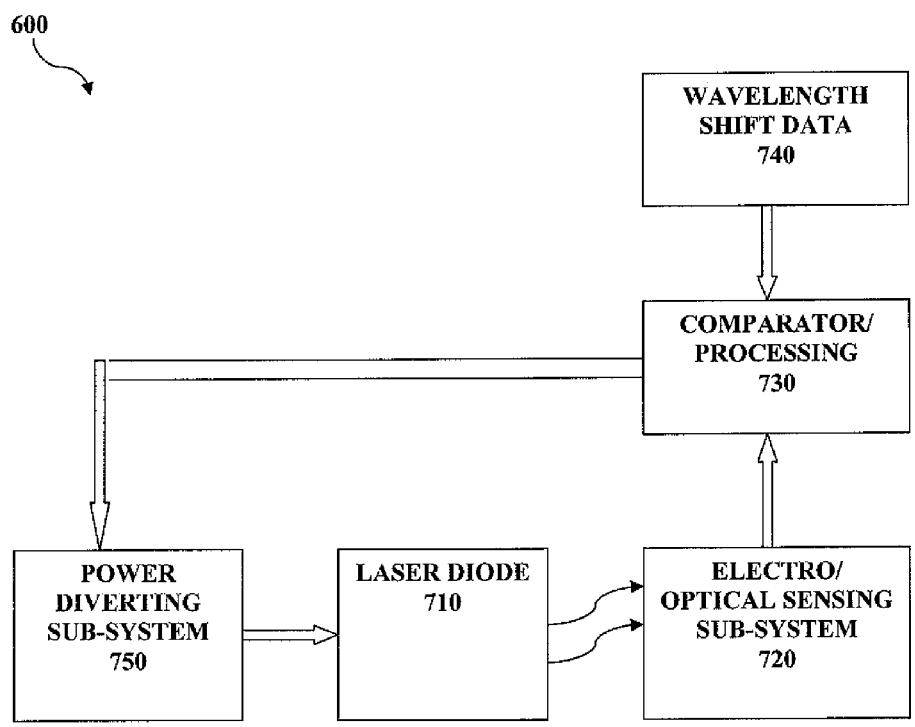
FIG. 6a is a schematic block diagram representation of yet another embodiment of the system for diode protection.

FIG. 6a shows a schematic block diagram representation of yet another embodiment of a system 600 of these teachings. Referring to FIG. 6a, an optical sensing device 720, such as, but not limited to, an optical system sampling a fraction of the total output of the laser diode (or junction device) or sensing the emission emanating from the back facet, senses the wavelengths of the laser diode output. One embodiment, but not limited to, of the optical system sampling a fraction of the output of the laser diode is an optical filter constructed with multi-layer dielectric coatings. Another embodiment, shown in FIG. 19, is a volume Bragg grating. The filter or grating as is would be designed to pass wavelengths longer or/and shorter than the wavelengths associated with normal stable operation of the laser diode. For example, in a diode designed to radiate at 808 nm at normal operating temperature, most of the radiation is contained in a band of approximately a 2 nm width about 808 nm. If it was desired in one exemplary embodiment, not a limitation of these teachings, to detect a temperature rise of 50° K., then the filter would be designed to pass wavelengths above 820.5 mm, and to reject or absorb wavelengths below 820.5 nm. A small fraction of the light from the diode would be sampled and sent to the filter. Any light with wavelength greater than a preselected value (820.5 nm in the example discussed above) then passes through the filter and is detected on a standard photodetector sensitive at wavelengths of the preselected value (820.5 nm in the example discussed above) and above.

Wavelength shift data (previously obtained) 740 is compared to the output of the optical sensing device 720 by a comparison/processing system 730. In one embodiment the wavelength shift data (previously obtained) 740 provides a predetermined threshold. When the signal from the optical system sampling a fraction of the output reaches a certain threshold, the detector signal indicates that the laser diode operation has departed from desired operation.

Figure 6B:
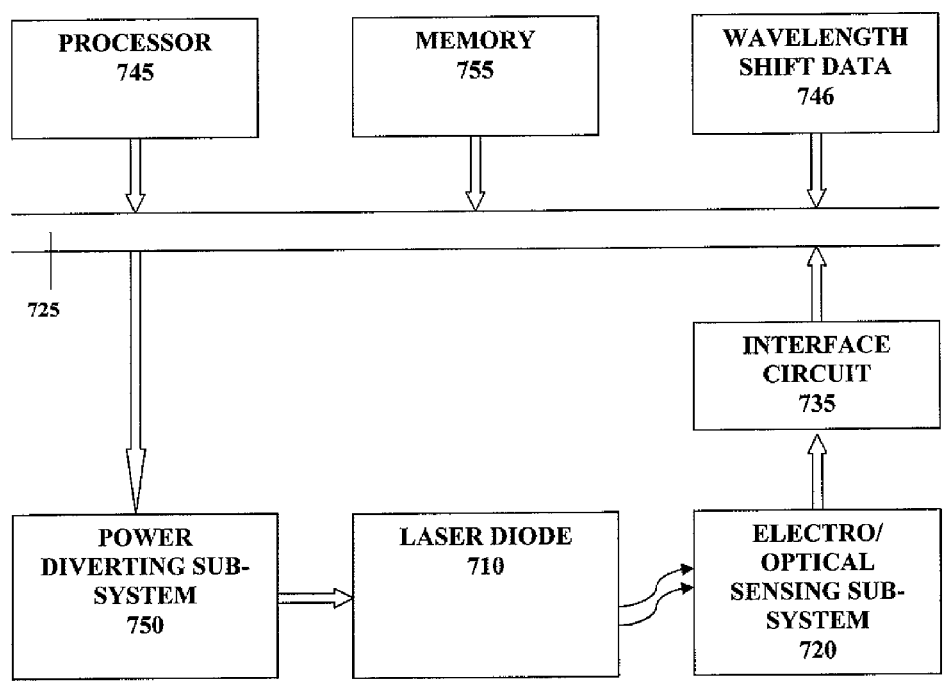

One embodiment of the comparison/processing system 730 is shown in FIG. 6b. Referring to FIG. 6b, the optical sensing device 720 provides laser diode wavelength data via an interface circuit 735 to an operable connection 725, such as a computer bus. A computer readable memory 755, also connected to the operable connection 725, has a computer readable code embodied therein to instruct a processor 745 to compare the measured value to the data from a stored pattern (or behavior), and generate a power modifying signal if the measurement significantly departs from the behavior. Upon receipt of the power modifying signal, the power system 750 modifies the power from laser diode 710.

Figure 6C:
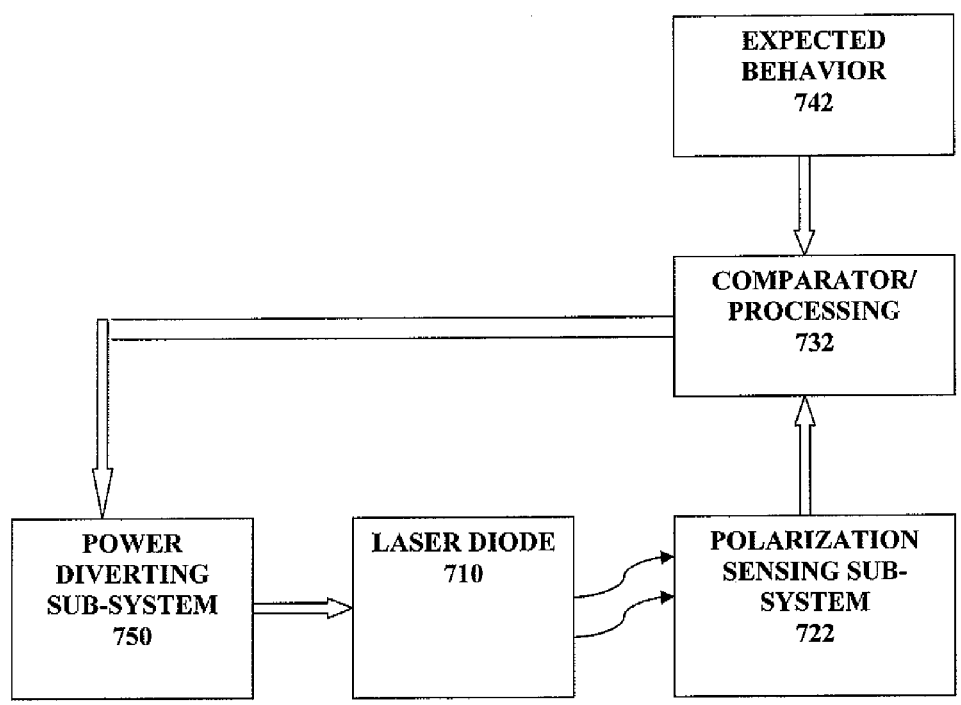
FIG. 6c is a schematic block diagram representation of a further embodiment of the system of these teachings.

FIG. 6c shows a schematic block diagram representation of a further embodiment of a system 600 of these teachings. Referring to FIG. 6b, a polarization detecting subsystem 722, including an optical sensing subsystem, such as, but not limited to, an optical system sampling a fraction of the total output of the laser diode (or junction device) or sensing the emission emanating from the back facet, senses the wavelengths of the laser diode output, and a polarization sensing device, such as, but not limited to, a polarizer, detects at least one polarization of a portion of the electromagnetic radiation emanating from the semiconductor junction. One embodiment, but not limited to, of the optical system sampling a fraction of the output of the laser diode is an optical filter. The filter or grating as is would be designed to pass polarizations different from than the polarizations associated with normal stable operation of the laser diode. For example, these teachings not be limited to that example, in a diode designed to radiate vertically polarized electromagnetic radiation, anomalous behavior (such as, but not limited to, filamentation) will result in a portion of the emitted radiation being horizontally polarized. In the preceding example, the polarization filter would be designed to pass horizontally polarized electromagnetic radiation and to substantially block virtually polarized electromagnetic radiation ("light"). A small fraction of the light from the diode would be sampled and sent to the filter. Any horizontally polarized light would pass through the filter and would be detected.

The output of the polarization detecting subsystem 722 is compared against a threshold (or expected behavior) 742 by a comparison/processing system 732. When the signal from the polarization detecting subsystem 722 reaches a certain threshold, the detector signal indicates that the laser diode (or semiconductor junction device) operation has departed from desired operation.

Figure 6D:
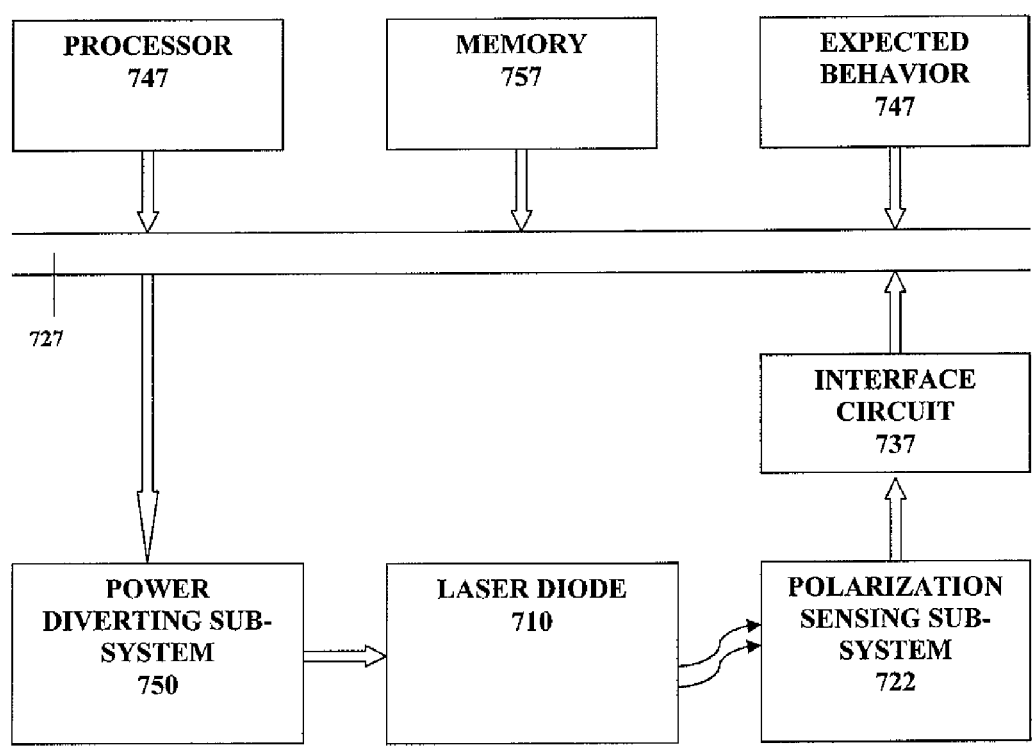
FIG. 6d is a schematic block diagram representation of a detailed embodiment of the system of FIG. 6c.

One embodiment of the comparison/processing system 732 is shown in FIG. 6d. Referring to FIG. 6d, the polarization detecting subsystem 722 provides laser diode (unction device) polarization data via an interface circuit 737 to an operable connection 727, such as a computer bus. A computer readable memory 757, also connected to the operable connection 727, has a computer readable code embodied therein to instruct a processor 747 to compare the measured value to the data from a stored pattern (or behavior), and generate a power modifying signal if the measurement significantly departs from the behavior. Upon receipt of the power modifying signal, the power system 750 modifies the power from laser diode (semiconductor junction device) 710.

In the embodiments of the system of these teachings shown in FIGS. 5a-5b and 6a-6d the means for providing data are different depending on whether the comparator in the system operates as a mostly digital or mostly analog. For a mostly digital comparator, a pattern or value(s) is stored in a computer readable memory. A pattern could be stored as a set of instructions that cause a processor to calculate the pattern. The pattern or data is provided or retrieved by the processor. For a mostly analog comparator, a value is stored as a reference quantity (voltage, for example) and pattern is obtained from an analog circuit (or a digital implementation and a D/A circuit). The reference value or pattern signal is provided as an input to the mostly analog comparator.

The embodiments of the systems of these teachings shown in FIGS. 5b, 6a-6d depict only one laser diode (or junction device). It should be noted that the systems of these teachings shown in FIGS. 5b and 6a-6d also apply to multiple laser diodes. The extension to multiple laser diodes can be obtained by comparison with FIG. 5a.

It should be noted that in the embodiments presented above, comparisons between measured and desired quantities are performed to within instrument or experimental error and therefore the comparison result is either substantially in agreement, or when an action results from the comparison, it is due to being substantially different (to the excess of error margins).

Exemplary, but not limited to, embodiments of the components of the above-described systems are shown in U.S. Patent Application Publication No. US 2003/0039280 A1, corresponding to U.S. patent application Ser. No. 10/165,195, which is incorporated by reference herein.

One embodiment, but not limited to, of a current indicator device that generates an output signal indicative of the current passing to the junction device comprises a transformer coupled to an input of a comparator to generate a voltage indicative of the current flowing to the junction device.

An embodiment, but not limited to, of a voltage monitoring device that generates an output signal indicative of the voltage across the junction device comprises a comparator configured to monitor the voltage across a laser diode source, such as 460 in FIG. 5a or 560 in FIG. 5b. As described below, comparator 1036 becomes conductive in the event that the voltage across the laser diode source drops below a threshold voltage. The comparator may be any device having a conductivity that depends on a voltage input. For example, the comparator may be a transistor. In one embodiment, the comparator is a bipolar transistor having a switching rate of 1000 MHz. The comparator may, in some embodiments, be combination of devices such as an operational amplifier in combination with a transistor, where the operational amplifier monitors the voltage across the laser diode source and produces an output to the transistor, which becomes conductive upon receiving the operational amplifier output.

A signal indicative of the voltage and a signal indicative of the current may be used to produce a signal indicative of a relationship between the voltage and the current, such as the impedance of a laser diode.

It should be noted that although in some of the embodiments presented above the methods and systems of these teachings are described in terms of the device terminal voltage, in some embodiments the methods and systems can also be implemented in terms of the device junction voltage. The term "device voltage" as used hereinafter refers to, but not limited to, device terminal voltage (also called terminal voltage) or device junction voltage (also called junction voltage).

As disclosed hereinabove, the method and system for the detection of anomalies in diode junction behavior disclosed in U.S. patent application Ser. No. 10/922,753 and the corresponding U.S. Published patent application, which are incorporated by reference herein, or/and other design techniques (such as, but not limited to, applying waveguide concepts in the laser design) are applied to substantially ameliorate the effects of anomalous behavior, such as filamentation.

It should be noted that the systems of these teachings (as well as the systems disclosed in U.S. patent application Ser. No. 10/922,753 and U.S. patent application Ser. No. 11/388,843) can be partially (or in some cases completely) integrated onto the laser diode bar. The integrated circuit/laser diode on-a-chip provides for the control of the current and/or power to each emitter. Controlling the current also controls the changes due to carrier effects.

If a laser diode array, the onset of anomalous behavior, such as filamentation, in one or more of the lasers will disrupt the array operation. The methods and systems of U.S. patent application Ser. No. 10/922,753 and U.S. patent application Ser. No. 11/388,843, can be used to sense the onset of anomalous behavior, such as filamentation, and to substantially divert the power away from or reduce the power to the laser experiencing the onset of anomalous behavior, such as filamentation. In this manner, the laser diode array operation can be continued since the laser experiencing the onset of anomalous behavior, such as filamentation, is temporarily removed from the system (since the power is substantially diverted away from that laser) while the condition of anomalous behavior, such as filamentation, exists in that laser.

Figure 6E:
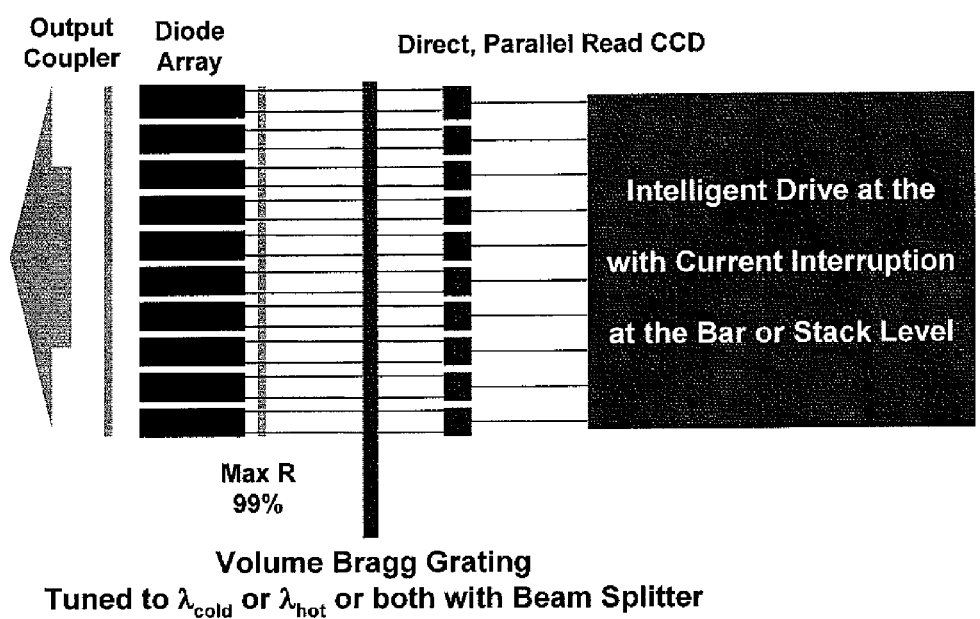
FIGS. 6e-6f are schematic graphical representations of yet even further embodiments of the system of this invention.
Figure 6F:
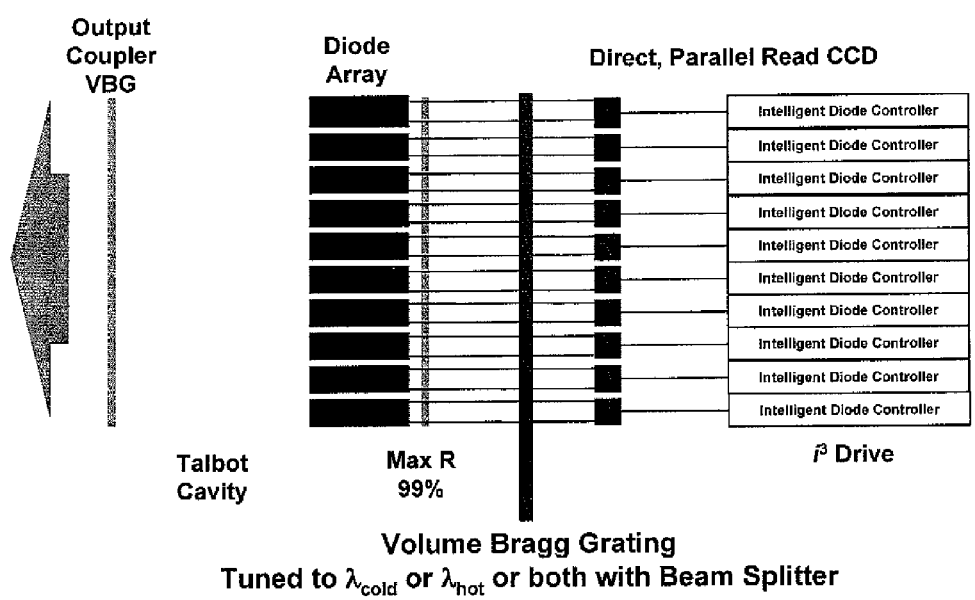
Figure 7A:
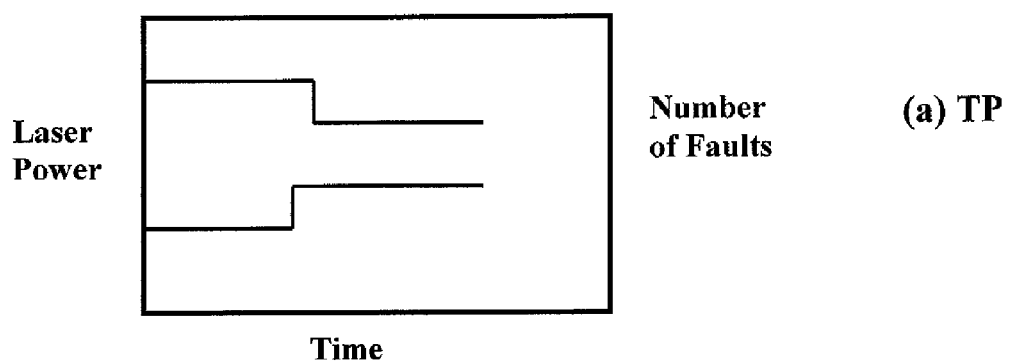
Figure 7B:
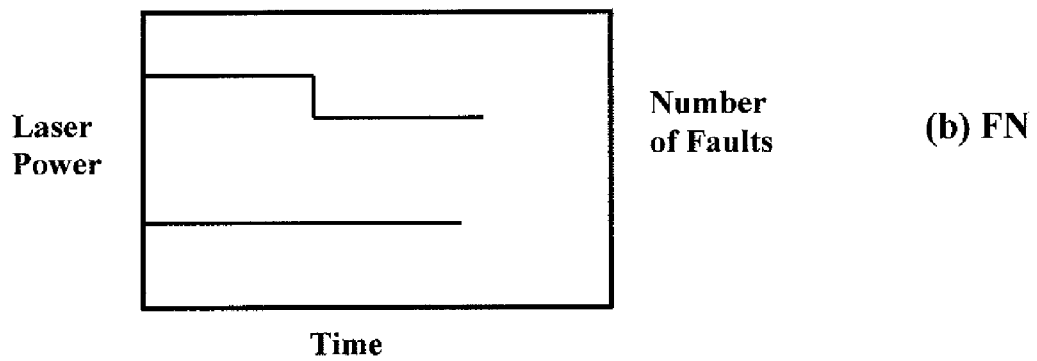

Referring to FIGS. 6e and 6f (FIGS. 19 and 20 of U.S. patent application Ser. No. 11/388,843), when anomalous behavior, such as filamentation, occurs the laser spectral content will be both red and blue shifted. According to one explanation, this spectral shifting occurs because the region that has the filament will be hotter than the rest of the gain medium while the remainder is cooler. The spectrum from the hotter region will be red shifted, as the band gap decreases with temperature, while the spectral content from the remainder of the gain medium will be cooler and the spectral content will be blue shifted. As in the embodiment shown in FIG. 6e and FIG. 6f (FIG. 19 and FIG. 20 of U.S. patent application Ser. No. 11/388,843), one can observe the radiation, for example, from the rear of the individual emitters. The radiation emanating from laser diodes propagate through a narrow volume Bragg grating before being detected by an array of photo detectors. The Bragg grating can be tuned to either the hot or cold (red shifted or blue shifted) regions of the spectra. Should any of the detectors observe a signal, then a signal is immediately sent to the driver to divert the power from the emitter in question. The power is diverted for a predetermined time, in one embodiment, approximately three thermal time constants, before it is turned on again. By this means the performance and lifetime of the laser diode can be increased and phase lock is preserved in laser diode arrays. In some embodiments, it may not be necessary to remove the all the power, but instead decrease the power.

Figure 1:
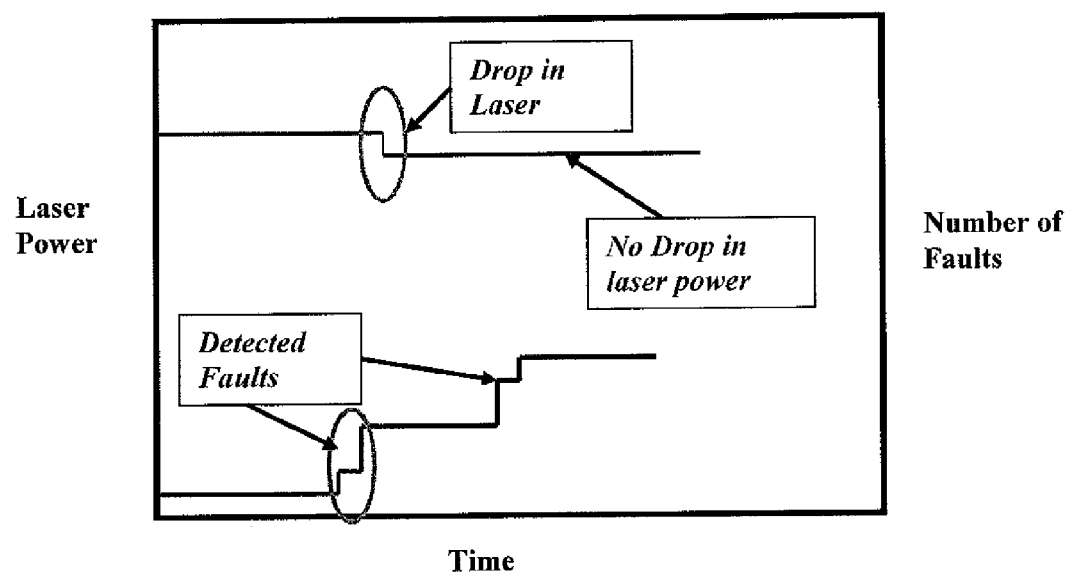
FIG. 1 is a schematic graphical depiction of an exemplary instance illustrating the effects of noise.

In the embodiment shown in FIG. 3a through FIG. 6b, the detection of the anomaly is performed by comparing the observed device behavior to a predetermined behavior (predetermined behavior is hereinafter referred to as a "threshold"). As shown in FIG. 1, comparing to a threshold in the presence of noise can, in some instances, result in an anomaly being detected when an anomaly is not present.

In one embodiment of the method of these teachings, the method is utilized for selecting a threshold ("threshold sensitivity") for detecting anomalous behavior of a semiconductor diode junction. In that embodiment the method includes the steps of:

a) selecting a threshold sensitivity value such that substantially no anomalous behavior is detected;
b) reducing the threshold sensitivity by a predetermined amount;
c) for one time interval from a number of time intervals, detecting optical power emitted from the semiconductor diode junction;
d) for that one time interval, determine whether anomalous behavior of the semiconductor junction diode has occurred;
e) for that one time interval, determining, according to predetermined criteria, whether the determination of whether anomalous behavior has occurred is a true positive (TP), a false-negative (FN), a false-positive (FP) or a true negative (TN);
f) repeating steps c) through e) for each other time interval in the number of time intervals;
g) determining, according to other predetermined criteria, a true positive fraction (TPF) and a false-positive fraction (FPF), a TPF, FPF pair corresponding to the threshold sensitivity;
h) repeating steps b) through g), obtaining the TPF, FPF pair corresponding to each threshold sensitivity;
i) selecting from the TPF, FPF pairs, according to a selection criterion, a desired threshold sensitivity for detection of anomalous behavior.

When anomalies are detected, typically accompanied by a drop in the laser power, the detection signal is a true positive (TP). When anomalies are detected with no change in the laser power the detection signal is a false positive (FP). The number of TPs and FPs detected will depend on the sensitivity of the detection circuit, the noise and the amplitude of the electrical transient resulting from an anomaly (a filament in some instances).

In Peterson, W.; Birdsall, T.; Fox, W, *The theory of signal detectability*, IEE Transactions on Information Theory, Volume 4, Issue 4, Date: September 1954, Pages: 171-212, which is incorporated by reference herein, methods are disclosed to consider signal detection in the presence of noise. Among those methods is the method known as the receiver operating characteristic (ROC) curve.

Figure 2:
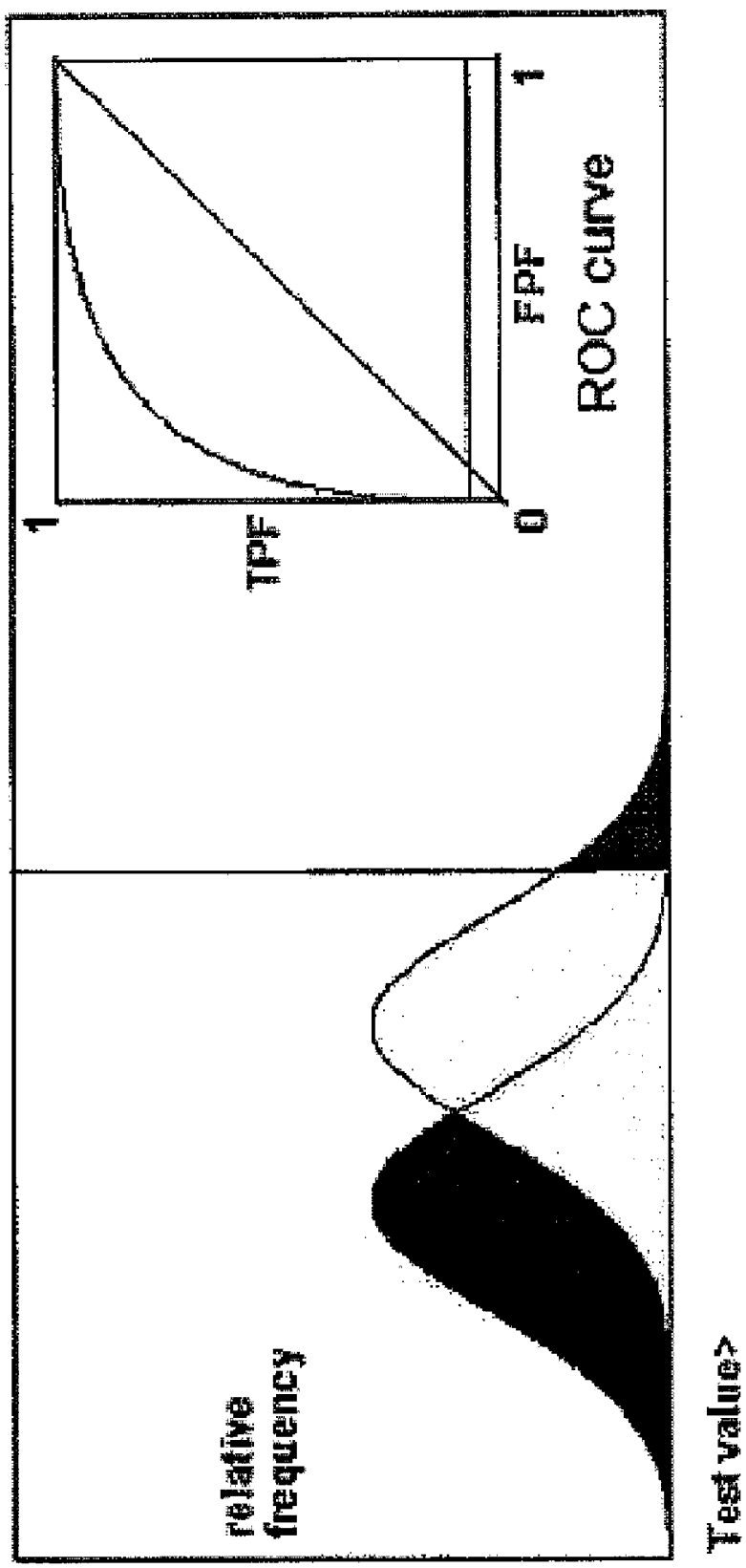
FIG. 2 is a schematic graphical depiction of selections of a threshold based on statistical considerations.

As shown in FIG. 2, by selecting the threshold it is possible to obtain an operating point where the true positive fraction is increased while the false positive fraction is reduced. The results of probabilistic detection theory (as in. the Peterson, W.; Birdsall, T.; Fox, W, publication referred to hereinabove) can be applied to the detection circuit for anomalies. The noise statistics can be obtained by prior measurement, by collecting statistics on device behavior or by other means (such as theoretical considerations). In one instance, the detection theory methods are incorporated in the computer memory 475 of FIG. 5a or in the memory 755 of FIG. 6b. In another instance, the detection theory methods are applied off-line and a threshold provided to the stored pattern 540 of FIG. 5b or the wavelength shift data 740 of FIG. 6a.

In one embodiment of the method of these teachings, the ROC is derived by the following steps:

a) A drop in optical power is always considered a fault. The drop in optical power could occur rapidly as shown in FIG. 1, or over an extended period of time
b) A number of other events could also be considered a fault. For the sake of definiteness we will consider a voltage transient as a fault, with the understanding that it is representative of events that might be correlated with a drop in optical power.
c) The optical power and the voltage transients are then detected as a function of time.
d) The temporal data of optical power output and the voltage transients are divided into a number of time bins
e) In any time bin which will be considered an event,
  i. A True Positive (TP) is defined as a detected voltage transient accompanied by a drop in optical power
  ii. A False Negative (FN) is defined as a drop in optical power that is not accompanied by a voltage transient
  iii. A False Positive (FP) is defined by a voltage transient that is not accompanied by a drop in the optical power
  iv. A True Negative (TN) is defined as a time bin with no drop in the optical voltage and no detected voltage transient
  v. The above statements are summarized in "truth table" (table 1) below, in which no is represented as a "0" and yes as a "1" and in FIGS. 7a-7d.

f) After a period of time that has a statistically significant number of events, TP, FN, FP and TN are recorded and from this data, the True Positive Fraction (TPF), False Positive Fraction (FPF) are calculated as follows:

$TPF=TP/(TP+FN)$, and $FPF=FP/(FP+TN)$ g) To derive the ROC for a particular laser diode, laser diode bar or laser diode array, The threshold sensitivity of the fault detection circuit is set high enough such that substantially no faults are detected. Under these conditions both TPF and FPF are zero.

The threshold sensitivity is then decreased and recording the detected faults and observing their correlation with a decrease in the laser power again calculate TPF and FPF. This process is continued until these two fractions are almost unity.

TABLE 1

| Voltage transient | Optical power loss | Fault | Label |
|---|---|---|---|
| 0 | 0 | 0 | TN |
| 0 | 1 | 1 | FN |
| 1 | 0 | 0 | FP |
| 1 | 1 | 1 | TP |

Figure 8:
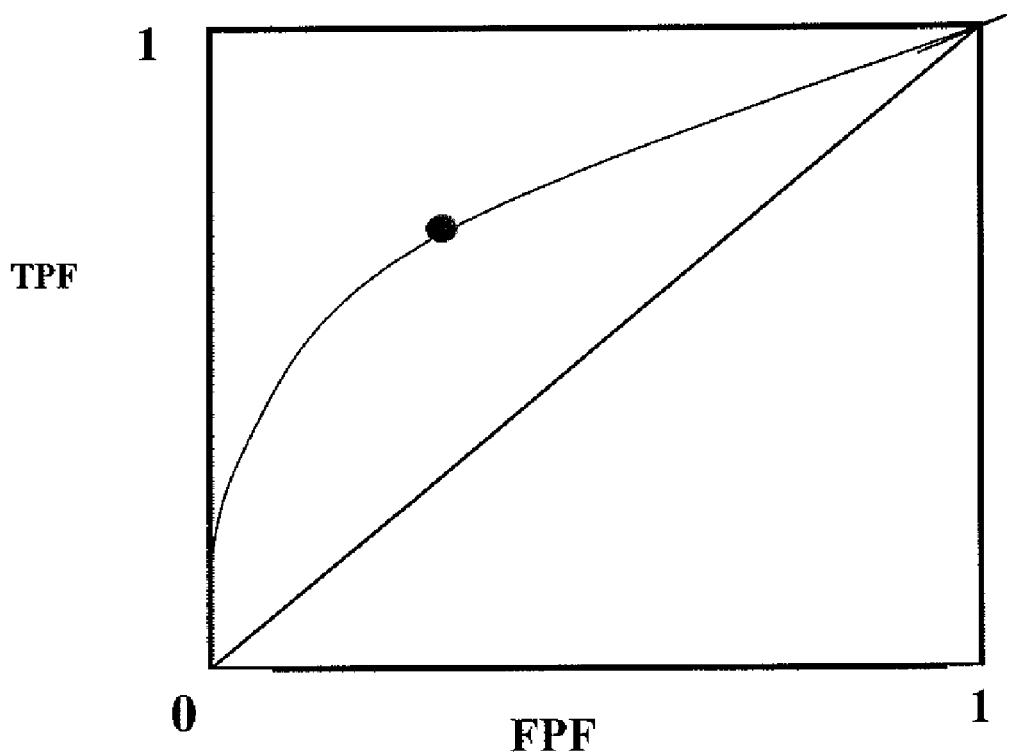
FIG. 8 depicts an ROC curve with an operating point (dot) chosen by an embodiment of the method of these teachings.

Once the ROC is obtained the substantially optimum sensitivity of the detection circuit (shown as a dot in FIG. 8) is chosen on the basis of a tradeoff between true positives and false positives, ROC may be periodically updated.

In another embodiment of the method of these teachings for selecting a threshold sensitivity for detecting anomalous behavior of a semi conductor diode Junction, the method includes the step of:

a) determining a relationship between a rate of false positive detections of anomalous behavior and the threshold sensitivity;

b) Selecting a value of threshold sensitivity that provides substantially a maximum rate of false positive detections for a predetermined duty factor.

Figure 9A:
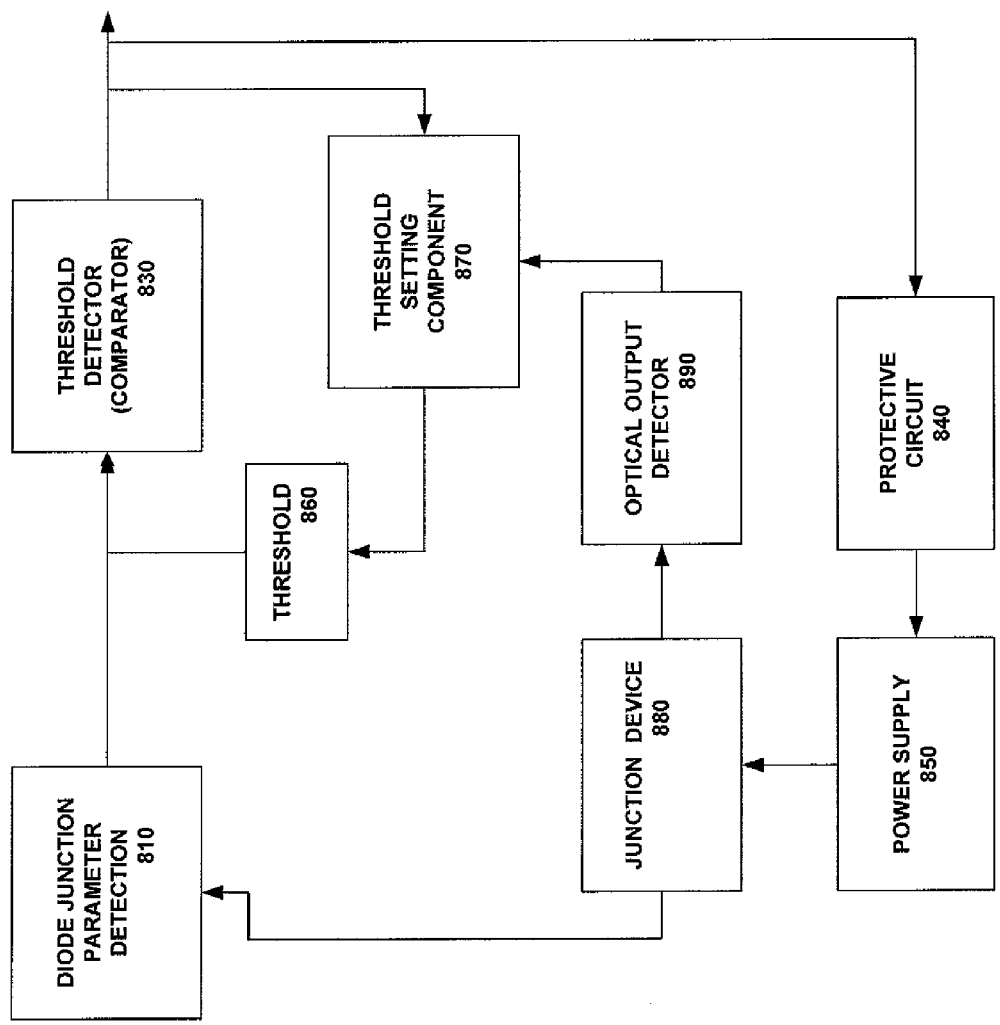
FIGS. 9a-9c depicts Schematic representations of embodiments of the system of these teaching.
Figure 9B:
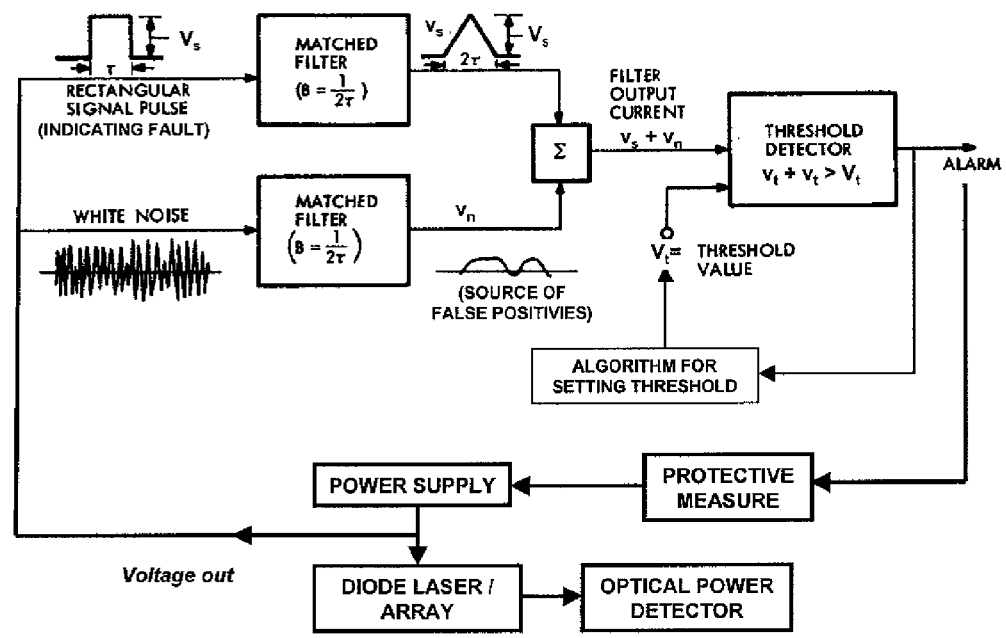
Figure 9C:
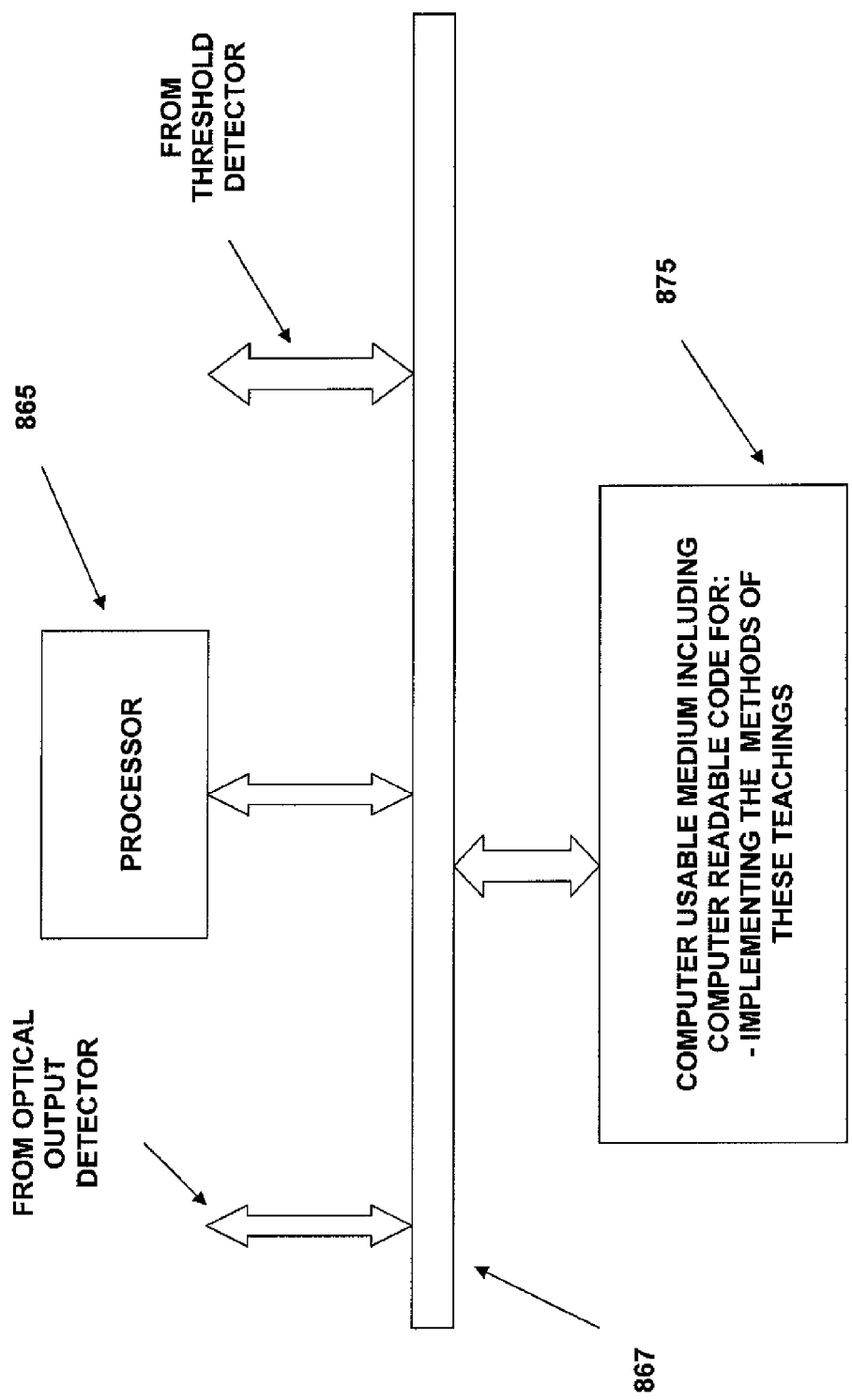

Embodiments of the Method and system of these teachings for choosing the substantially optimum operating point and updating the ROC periodically are shown in FIGS. 9a, 9b, 9e, and disclosed below. Referring to FIG. 9a, a parameter of the semiconductor diode junction device 880 is monitored by the diode junction parameter detection component 810. The output of the diode junction parameter detection component is provided to a threshold detector 830 and compared to a threshold 860. The output of the threshold detector 830 is provided to a threshold setting component 870 and to a protective circuit 840. The optical output (power) emitted by the semiconductor junction device 880 is detected by an optical output detector 890. The signal indicative of optical output obtained from the optical output detector 890 is also provided to this threshold setting component 870. The threshold setting component 870 can update the threshold 860. If the output of the threshold detector 830 indicates that anomalous behavior has occurred, the protective circuit 840 can modifying (reduce or divert) the power input (from power supply 850) to the junction device 880. In one instance, as shown in FIG. 9c, the threshold setting component 870 includes one or more processors 865 and one or more computer usable media 875, where the computer usable media 875 has computer readable code embodied therein to implement methods for obtaining the ROC, updating the ROC, or/and setting the threshold. The one or more processors 865, the computer usable media 875 and the output of the optical output detector and the threshold detector are operatively connected by a connection component 867 (a computer bus in one embodiment).

In one instance, the computer readable code can cause the computer to calculate the true positive fraction (TPF) and the false positive fraction (FPF) as described above and compared to the previous determine ROC, or obtain a threshold that substantially maximizes the true positive fraction and substantially minimizes the false positive fraction.

A schematic of one embodiment of an intelligent laser diode (semi conductor diode Junction device) driver is shown in FIG. 9a. In operation of the embodiment shown in FIG. 9a, these teachings not being limited to only that embodiment, the monitoring of voltage transients (in other embodiments other diode characteristics can be monitored, such as the diode characteristics monitory in the embodiments disclosed hereinabove in FIGS. 5a-5d and 6a-6f), represented by a square topped voltage signal of height VS and width T, are passed through a filter having a bandwidth B resulting in a change in the shape of the transient voltage signal. The signal and noise are provided to a voltage threshold detector (a competitor in one embodiment) that sends a signal (or alarm) to the laser driver or power supply, recommending that a preventive measure, which (as discussed in U.S. patent application Ser. No. 10/922,753 and 11/351,700) results in diverting or reducing the power to the laser diode or laser diode array for a predetermined period of time. The transient could be a TP or a FP.

The embodiment shown in FIGS. 9a, 9b, 9c can be utilized for substantially periodically and automatically updating the ROC. In the embodiment shown in FIG. 9b, the voltage transients are monitored. (It should be noted that other semiconductor diode junction characteristics can be monitored and that these teachings are not limited to only the embodiment shown in FIG. 9b.) The voltage and noise are both filtered by the same filter and then added, before they are inserted into the voltage threshold detector. If the noise is zero, then the threshold detector will always detect TPs. However because of the noise, and depending on the signal-to noise-ratio, the threshold detector will detect both true positives and false positives. Whenever a signal is detected, whether it is a TP of PP, a protective measure, which is the removal of all or some of power from the laser diode array or laser diode for a predetermined period of time, will be instituted. The protective measures have been discussed in U.S. patent application Ser. No. 10/922,753 and 11/351,700. The threshold for the voltage threshold detector can be raised which will result in both fewer TPs and FPs. Embodiments of the method of these teachings for setting the threshold level are disclosed herein.

Figure 10:
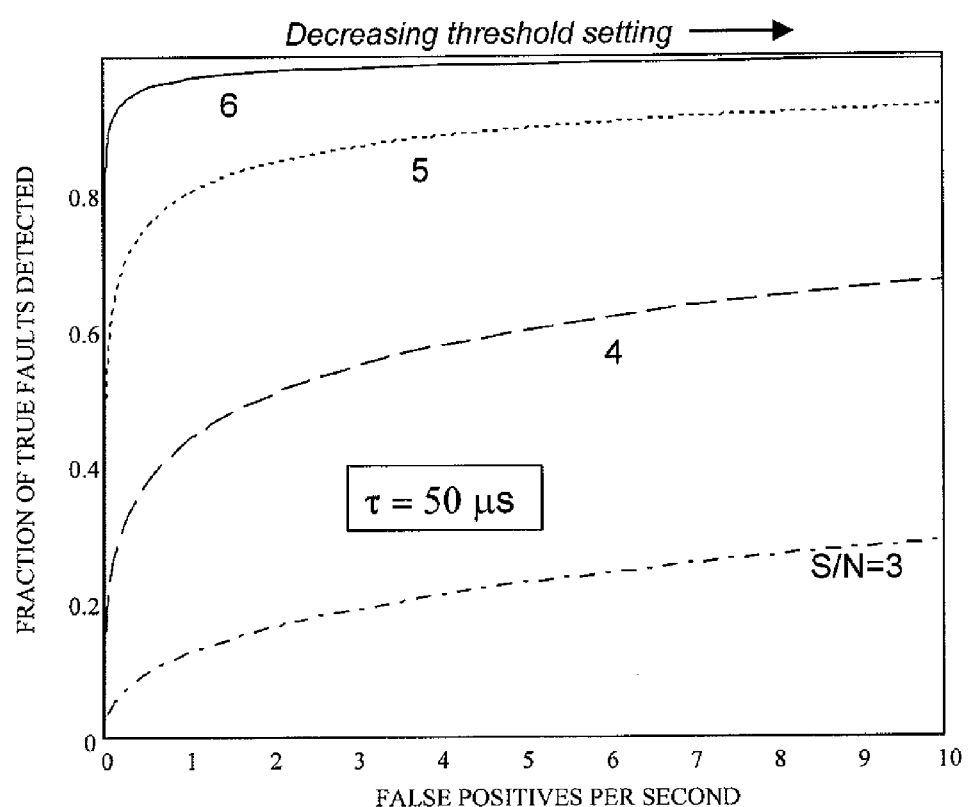
FIG. 10 is a graphical schematic representation of TPs vs. the FP rate as a function of the signal-to noise ratio (S/N).

In one embodiment of the method of these teachings for setting the threshold, the decision is made based on a minimum duty factor. Since when a signal is detected in the system of FIG. 9a or 9b, the power is removed or reduced from the laser diode or laser diode array, the higher the rate of signals detected the lower the duty factor. FIG. 10 is a plot of the fraction of TPs as a function of the FP rate. One embodiment of the method of these teachings for setting the threshold is based on a maximum FP rate consistent on the duty factor. It is should be noted that the FP rate can be determined without operating the laser diode or laser diode array, since the FP rate is entirely based on the noise. Hence the FP rate can be determined and the threshold set a proiri.

In another embodiment of the method and system for setting the threshold, the threshold setting component 870, implemented in one instance as shown in FIG. 9c, has computer readable code embodied therein, in the instance where noise statistics are known a priori or obtained by prior measurement or collected during operation of the system, that obtains a true positive fraction (TPF) and a probability of obtaining a true positive, and that determines a threshold by detection theory methods.

There are other noises sources to consider including, noise arising in measuring the optical power, fluctuations in the laser output power. These noise sources will increase the rate of false positives and can be taken into consideration into embodiments of the method of these teachings for setting the threshold. The embodiment shown in FIGS. 9a, 9b, 9c can be used to compare the false positive fraction (FPF) during operation to the previously determined ROC.

Although the above embodiments have been described in reference to laser diode protection, the methods and systems of this invention can be utilized for protection of semiconductor devices with diode junctions.

Although these teachings has been described with respect to various embodiments, it should be realized these teachings are also capable of a wide variety of further and other embodiments within the spirit of the appended claims.

What is claimed is:

1. A method for selecting a threshold sensitivity for detecting anomalous behavior of a semi conductor diode Junction, the threshold sensitivity being used in a semiconductor diode Junction device testing system, the method comprising the steps of:
   a. selecting a threshold sensitivity value such that substantially no anomalous behavior is detected;
   b. reducing the threshold sensitivity by a predetermined amount;
   c. for one time interval from a plurality of time intervals, detecting, utilizing an optical power detector, optical power emitted from the semiconductor diode junction;
   d. for said one time interval from said plurality of time intervals, determining, from detection of semiconductor diode Junction parameters and utilizing the threshold sensitivity, whether anomalous behavior of the semiconductor junction diode has occurred;
   e. for said one time interval, determining, according to predetermined criteria, whether the determination of whether anomalous behavior has occurred is a true positive (TP), a false-negative (FN), a false-positive (FP) or a true negative (TN);
   f. repeating steps c) through e) for each time interval in said plurality of time intervals;
   g. determining, according to other predetermined criteria, a true positive fraction (TPF) and a false-positive fraction (FPF), a TPF, FPF pair corresponding to the threshold sensitivity;
   h. repeating steps b) through g), obtaining the TPF, FPF pair corresponding to each threshold sensitivity; and
   i. selecting from the TPF, FPF pairs, according to a selection criterion, a desired threshold sensitivity for detection of anomalous behavior;
   whereby the threshold sensitivity is utilized in a threshold detector to detect anomalous behavior of the semiconductor diode Junction device.

2. The method of claim 1 wherein the threshold sensitivity is a predetermined semiconductor junction device voltage behavior; and wherein the anomalous behavior is detected by comparing semiconductor junction device voltage to the threshold sensitivity.

3. The method of claim 1 wherein the threshold sensitivity is a predetermined semiconductor junction device current behavior; and wherein the anomalous behavior is detected by comparing semiconductor junction device current to the threshold sensitivity.

4. The method of claim 1 wherein the threshold sensitivity is a predetermined semiconductor junction device emitted wavelength behavior; and wherein the anomalous behavior is detected by comparing semiconductor junction device emitted wavelength to the threshold sensitivity.

5. The method of claim 1 wherein the threshold sensitivity is a predetermined semiconductor junction device emitted polarization behavior; and wherein the anomalous behavior is detected by comparing semiconductor junction device emitted polarization to the threshold sensitivity.

6. The method of claim 1 wherein the total positive fraction is substantially equal to the ratio of a number of true positives to the sum of the number of true positives and a number of false negatives; and wherein the false-positive fraction is substantially equal to the ratio of a number of false positives to the sum of the number of false positives and a number of true negatives.

7. The method of claim 1 wherein said predetermined criteria comprises:
   identifying the determination that anomalous behavior of the semiconductor junction diode has occurred as a true positive (TP) when the detected optical power is less than an optical power detected at a preceding time interval;
   identifying the determination that anomalous behavior of the semiconductor junction diode has not occurred as a false-negative (FN) when the detected optical power is less than an optical power detected at a preceding time interval;
   identifying the determination that anomalous behavior of the semiconductor junction diode has occurred as a false-positive (FP) when the detected optical power is not less than an optical power detected at a preceding time interval; and
   identifying the determination that anomalous behavior of the semiconductor junction diode has not occurred as a true-negative (TN) when the detected optical power is not less than an optical power detected at a preceding time interval.

8. The method of claim 1 wherein the selection criteria comprises substantially maximizing the true positive fraction and substantially minimizing the false-positive fraction.

9. A method for selecting a threshold sensitivity for detecting anomalous behavior of a semiconductor diode Junction, the threshold sensitivity being used in a semiconductor diode Junction device testing system, the method comprising the step of:
   a. determining a relationship between a rate of false positive detections of anomalous behavior and the threshold sensitivity; and
   b. selecting a value of threshold sensitivity that provides substantially a maximum rate of false positive detections for a predetermined duty factor;
   whereby the threshold sensitivity is utilized in a threshold detector to detect anomalous behavior of the semiconductor diode Junction device; the anomalous behavior comprising non uniformities/instabilities in local current density and/or temperature of the semiconductor diode junction.

10. A system for selecting a threshold sensitivity for detecting anomalous behavior of a semi conductor diode Junction, the system comprising:
   a component for detecting a value of a predetermined parameter of a semiconductor junction device;
   a threshold detector capable of receiving said detected value of the predetermined parameter and a threshold value, said threshold device being capable of providing a signal indicative of whether anomalous device behavior has occurred;

a device protection component capable of reducing power from the semiconductor junction device when said signal indicates that anomalous device behavior has occurred;

an optical output detector capable of providing a detector signal indicative of optical output of the semiconductor junction device; and a threshold determining component capable of receiving said detector signal and said signal and of providing the threshold value to said threshold detector.

11. The system of claim 8 wherein said threshold determining component comprises:

at least one processor; and at least one computer usable medium having computer readable code embodied therein, said computer readable code being capable of causing said at least one processor to select a threshold value; said threshold value being provided to said threshold detector.

12. The system of claim 11 wherein said computer readable code is also capable of causing said at least one processor to update an ROC curve.

13. The system of claim 12 wherein said computer readable code is also capable of causing said at least one processor to:

a. select a threshold value such that substantially no anomalous behavior is detected;

b. reduce the threshold value by a predetermined amount;

c. for one time interval from a plurality of time intervals, detect, utilizing an optical power detector, power emitted from the semiconductor diode junction;

d. for said one time interval from said plurality of time intervals, determine, from detection of semiconductor diode Junction parameters and utilizing the threshold detector, whether anomalous behavior of the semiconductor junction diode has occurred;

e. for said one time interval, determine, according to predetermined criteria, whether the determination of whether anomalous behavior has occurred is a true positive (TP), a false-negative (FN), a false-positive (FP) or a true negative (TN);

f. repeat steps c) through e) for each time interval in said plurality of time intervals;

g. determine, according to other predetermined criteria, a true positive fraction (TPF) and a false-positive fraction (FPF), a TPF, FPF pair corresponding to the threshold value; and h. repeat steps b) through g), obtaining the TPF, FPF pair corresponding to each threshold value.

14. The system of claim 13 wherein the total positive fraction is substantially equal to the ratio of a number of true positives to the sum of the number of true positives and a number of false negatives; and wherein the false-positive fraction is substantially equal to the ratio of a number of false positives to the sum of the number of false positives and a number of true negatives.

15. The system of claim 13 wherein said predetermined criteria comprises:

identifying the determination that anomalous behavior of the semiconductor junction diode has occurred as a true positive (TP) when the detected optical power is less than an optical power detected at a preceding time interval;

identifying the determination that anomalous behavior of the semiconductor junction diode has not occurred as a false-negative (FN) when the detected optical power is less than an optical power detected at a preceding time interval;

identifying the determination that anomalous behavior of the semiconductor junction diode has occurred as a false-positive (FP) when the detected optical power is not less than an optical power detected at a preceding time interval; and identifying the determination that anomalous behavior of the semiconductor junction diode has not occurred as a true-negative (TN) when the detected optical power is not less than an optical power detected at a preceding time interval.

16. The system of claim 10 wherein a threshold selection criterion comprises substantially maximizing the true positive fraction and substantially minimizing the false-positive fraction.

17. The system of claim 10 wherein the threshold value is a predetermined semiconductor junction device voltage behavior; and wherein the component for detecting a value of a predetermined parameter determines semiconductor junction device voltage.

18. The system of claim 10 wherein the threshold value is a predetermined semiconductor junction device current behavior; and wherein the component for detecting a value of a predetermined parameter determines semiconductor junction device current.

19. The system of claim 10 wherein the threshold value is a predetermined semiconductor junction device emitted wavelength behavior; and wherein the component for detecting a value of a predetermined parameter determines semiconductor junction device emitted wavelength.

20. The system of claim 10 wherein the threshold value is a predetermined semiconductor junction device emitted polarization behavior; and wherein the component for detecting a value of a predetermined parameter determines semiconductor junction device emitted polarization.

* * * * *